(12) United States Patent
Liang et al.

(10) Patent No.: US 11,316,550 B2
(45) Date of Patent: Apr. 26, 2022

(54) BIASING OF CASCODE POWER AMPLIFIERS FOR MULTIPLE POWER SUPPLY DOMAINS

(71) Applicant: Skyworks Solutions, Inc., Irvine, CA (US)

(72) Inventors: Bang Li Liang, Ottawa (CA); Thomas Obkircher, Santa Ana, CA (US); Guillaume Alexandre Blin, Carlisle, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/247,889

(22) Filed: Dec. 29, 2020

(65) Prior Publication Data

US 2021/0218433 A1    Jul. 15, 2021

Related U.S. Application Data

(60) Provisional application No. 62/961,553, filed on Jan. 15, 2020.

(51) Int. Cl.
*H04B 1/40*      (2015.01)
*H03F 1/02*      (2006.01)
*H03F 3/24*      (2006.01)

(52) U.S. Cl.
CPC .............. *H04B 1/40* (2013.01); *H03F 1/0216* (2013.01); *H03F 3/245* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 7,576,426 | B2 | 8/2009 | Gan et al. |
| 7,629,201 | B2 | 12/2009 | Gan et al. |
| 7,642,135 | B2 | 1/2010 | Liang |
| 7,919,997 | B2 | 4/2011 | Obkircher |
| 7,956,656 | B2 | 6/2011 | Obkircher |
| 8,126,094 | B2 | 2/2012 | Komaili et al. |
| 8,135,881 | B1 | 3/2012 | Obkircher |
| 8,212,593 | B2 | 7/2012 | Obkircher |
| 8,417,836 | B2 | 4/2013 | Obkircher |
| 8,456,206 | B2 | 6/2013 | Namdar-mehdiabadi et al. |

(Continued)

*Primary Examiner* — Pablo N Tran
(74) *Attorney, Agent, or Firm* — Knobbe, Martens, Olson and Bear, LLP

(57) ABSTRACT

Cascode power amplifier bias circuits suitable for operating across multiple power supply domains are provided. In certain embodiments, a power amplifier system includes a cascode power amplifier and a multi-domain bias circuit that generates at least a first cascode bias voltage for the cascode power amplifier. The multi-domain bias circuit includes a coarse regulator that generates a regulated voltage based on a power supply voltage that is operable with multiple voltage levels associated with different power supply domains, a bandgap reference circuit that is powered by the regulated voltage and outputs a bandgap reference voltage, a bias voltage generator that generates multiple selectable bias voltages based on the bandgap reference voltage, and a bias voltage selector that chooses the first cascode bias voltage from amongst the selectable bias voltages.

20 Claims, 19 Drawing Sheets

(56) References Cited

U.S. PATENT DOCUMENTS

| | | |
|---|---|---|
| 8,456,244 B2 | 6/2013 | Obkircher et al. |
| 8,565,358 B2 | 10/2013 | Komaili et al. |
| 8,698,565 B2 | 4/2014 | Obkircher et al. |
| 8,823,459 B2 | 9/2014 | Obkircher et al. |
| 8,900,931 B2 | 12/2014 | Liang |
| 8,922,268 B2 | 12/2014 | Madan et al. |
| 8,948,322 B2 | 2/2015 | Komaili et al. |
| 8,975,950 B2 | 3/2015 | Madan et al. |
| 9,013,225 B2 | 4/2015 | Madan et al. |
| 9,054,716 B2 | 6/2015 | Obkircher et al. |
| 9,148,194 B2 | 9/2015 | Madan et al. |
| 9,153,551 B2 | 10/2015 | Liang |
| 9,160,328 B2 | 10/2015 | Altunkilic et al. |
| 9,225,349 B2 | 12/2015 | Bourdi et al. |
| 9,231,606 B2 | 1/2016 | Bourdi et al. |
| 9,276,570 B2 | 3/2016 | Madan et al. |
| 9,313,079 B2 | 4/2016 | Komaili et al. |
| 9,450,570 B2 | 9/2016 | Obkircher et al. |
| 9,450,579 B2 | 9/2016 | Madan et al. |
| 9,450,591 B2 | 9/2016 | Obkircher et al. |
| 9,450,593 B2 | 9/2016 | Bourdi et al. |
| 9,509,363 B2 | 11/2016 | Madan et al. |
| 9,548,786 B2 | 1/2017 | Obkircher et al. |
| 9,620,424 B2 | 4/2017 | Blin et al. |
| 9,621,118 B2 | 4/2017 | Ripley et al. |
| 9,628,075 B2 | 4/2017 | Cebi et al. |
| 9,654,122 B2 | 5/2017 | Bourdi et al. |
| 9,673,853 B2 | 6/2017 | Blum |
| 9,685,943 B2 | 6/2017 | Madan et al. |
| 9,692,479 B2 | 6/2017 | Obkircher et al. |
| 9,698,734 B2 | 7/2017 | Lehtola et al. |
| 9,698,736 B2 | 7/2017 | Ripley et al. |
| 9,721,936 B2 | 8/2017 | Zhu et al. |
| 9,722,547 B2 | 8/2017 | Ripley et al. |
| 9,741,653 B2 | 8/2017 | Roy et al. |
| 9,780,741 B2 | 10/2017 | Ripley et al. |
| 9,787,467 B2 | 10/2017 | Obkircher et al. |
| 9,806,676 B2 | 10/2017 | Balteanu et al. |
| 9,837,324 B2 | 12/2017 | Blin et al. |
| 9,852,978 B2 | 12/2017 | Roy et al. |
| 9,859,945 B2 | 1/2018 | Obkircher et al. |
| 9,923,594 B2 | 3/2018 | Madan et al. |
| 9,973,184 B2 | 5/2018 | Madan et al. |
| 9,985,588 B2 | 5/2018 | Rogers |
| 10,032,731 B2 | 7/2018 | Fuh et al. |
| 10,033,336 B2 | 7/2018 | Banowetz et al. |
| 10,056,901 B2 | 8/2018 | Roy et al. |
| 10,084,417 B2 | 9/2018 | Blum |
| 10,103,495 B2 | 10/2018 | Blin |
| 10,110,183 B2 | 10/2018 | Lyalin et al. |
| 10,147,724 B2 | 12/2018 | Madan et al. |
| 10,181,820 B2 | 1/2019 | Balteanu et al. |
| 10,187,023 B2 | 1/2019 | Andrys et al. |
| 10,229,902 B2 | 3/2019 | Zhu et al. |
| 10,230,351 B2 | 3/2019 | Obkircher et al. |
| 10,243,519 B2 * | 3/2019 | Dykstra ............... H03F 1/0227 |
| 10,250,199 B2 * | 4/2019 | Klaren ................ H03F 3/245 |
| 10,250,202 B2 | 4/2019 | Lehtola et al. |
| 10,255,982 B2 | 4/2019 | Zhou et al. |
| 10,256,921 B2 | 4/2019 | Bergsma et al. |
| 10,305,433 B2 * | 5/2019 | Ranta .................. H03F 1/56 |
| 10,892,720 B2 * | 1/2021 | Okabe ................ H03F 3/211 |
| 2007/0070608 A1 | 3/2007 | Warren et al. |
| 2008/0217708 A1 | 9/2008 | Reisner et al. |
| 2010/0067622 A1 | 3/2010 | Komaili et al. |
| 2014/0009210 A1 | 1/2014 | Madan et al. |
| 2014/0009212 A1 | 1/2014 | Altunkilic et al. |
| 2015/0171108 A1 | 6/2015 | Blin et al. |
| 2015/0171860 A1 | 6/2015 | Blin |
| 2016/0126199 A1 | 5/2016 | Roy et al. |
| 2016/0126832 A1 | 5/2016 | Zhou et al. |
| 2017/0077916 A1 | 3/2017 | Zhou et al. |
| 2017/0149390 A1 | 5/2017 | Rogers et al. |
| 2017/0300076 A1 | 10/2017 | Liang et al. |
| 2017/0302231 A1 | 10/2017 | Ripley et al. |
| 2018/0034661 A1 | 2/2018 | Zhou et al. |
| 2018/0062580 A1 | 3/2018 | Rogers |
| 2018/0131339 A1 | 5/2018 | Ye et al. |
| 2018/0131369 A1 | 5/2018 | Popplewell et al. |
| 2018/0138862 A1 | 5/2018 | Balteanu et al. |
| 2018/0138866 A1 | 5/2018 | Liang et al. |
| 2018/0138877 A1 | 5/2018 | Bergsma et al. |
| 2018/0138878 A1 | 5/2018 | Domino et al. |
| 2018/0144993 A1 | 5/2018 | Blin et al. |
| 2018/0158533 A1 | 6/2018 | Zhou et al. |
| 2018/0159478 A1 | 6/2018 | Balteanu et al. |
| 2018/0248523 A1 | 8/2018 | Rogers |
| 2018/0260358 A1 | 9/2018 | Obkircher et al. |
| 2018/0294781 A1 | 10/2018 | Rogers |
| 2018/0316312 A1 | 11/2018 | Sharma et al. |
| 2018/0316316 A1 | 11/2018 | Banowetz et al. |
| 2018/0336955 A1 | 11/2018 | Zhou et al. |
| 2018/0342469 A1 | 11/2018 | Fuh et al. |
| 2018/0351554 A1 | 12/2018 | Roy et al. |
| 2019/0123690 A1 | 4/2019 | Balteanu et al. |
| 2019/0123698 A1 | 4/2019 | Lyalin et al. |
| 2019/0123699 A1 | 4/2019 | Andrys et al. |
| 2019/0131936 A1 | 5/2019 | Blum |
| 2019/0180833 A1 | 6/2019 | Zhou et al. |
| 2019/0190623 A1 | 6/2019 | Bergsma et al. |
| 2019/0206863 A1 | 7/2019 | Blin et al. |
| 2019/0214984 A1 | 7/2019 | Blin |
| 2019/0253054 A1 | 8/2019 | Roy et al. |
| 2019/0273076 A1 | 9/2019 | Zhu et al. |
| 2019/0273470 A1 | 9/2019 | Rogers |
| 2019/0295672 A1 | 9/2019 | Zhou et al. |
| 2019/0318793 A1 | 10/2019 | Zhou et al. |
| 2019/0334493 A1 | 10/2019 | Domino et al. |
| 2019/0372526 A1 | 12/2019 | Balteanu et al. |
| 2019/0386005 A1 | 12/2019 | Madan et al. |
| 2019/0386104 A1 | 12/2019 | Roy et al. |
| 2019/0386624 A1 | 12/2019 | Ye et al. |
| 2020/0021249 A1 | 1/2020 | Liang et al. |
| 2020/0057746 A1 | 2/2020 | Obkircher et al. |
| 2020/0091902 A1 | 3/2020 | Zhou et al. |
| 2020/0099340 A1 | 3/2020 | Sharma et al. |
| 2020/0099346 A1 | 3/2020 | Lehtola et al. |
| 2020/0106405 A1 | 4/2020 | Lehtola |
| 2020/0112289 A1 | 4/2020 | Rogers |
| 2020/0153428 A1 | 5/2020 | Popplewell et al. |
| 2020/0161965 A1 | 5/2020 | Zhou et al. |
| 2020/0162028 A1 | 5/2020 | Balteanu et al. |
| 2020/0162032 A1 | 5/2020 | Ripley et al. |
| 2020/0212849 A1 * | 7/2020 | Kobayashi ............ H03F 3/45 |
| 2020/0259459 A1 | 8/2020 | Balteanu et al. |
| 2020/0272182 A1 | 8/2020 | Liang et al. |
| 2020/0272183 A1 | 8/2020 | Liang |
| 2020/0350247 A1 | 11/2020 | Zhou et al. |
| 2020/0395936 A1 | 12/2020 | Blin |

* cited by examiner

BIASING OF CASCODE POWER AMPLIFIERS FOR MULTIPLE POWER SUPPLY DOMAINS

CROSS-REFERENCE TO RELATED APPLICATIONS

This application claims the benefit of priority under 35 U.S.C. § 119 of U.S. Provisional Patent Application No. 62/961,553, filed Jan. 15, 2020 and titled "BIASING OF CASCODE POWER AMPLIFIERS FOR MULTIPLE POWER SUPPLY DOMAINS," which is herein incorporated by reference in its entirety.

BACKGROUND

Technical Field

Embodiments of the invention relate to electronic systems, and in particular, to radio frequency (RF) electronics.

Description of Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to, mobile phones, tablets, base stations, network access points, laptops, and wearable electronics. Power amplifiers provide amplification to RF signals, which can have a frequency in the range from about 30 kHz to 300 GHz, for instance, in the range of about 410 MHz to about 7.125 GHz for Fifth Generation (5G) cellular communications in Frequency Range 1 (FR1).

SUMMARY

In certain embodiments, the present disclosure relates to a power amplifier system. The power amplifier system includes a cascode power amplifier configured to amplify a radio frequency input signal, and a bias circuit configured to generate at least a first cascode bias voltage operable to bias the cascode power amplifier. The bias circuit includes a coarse regulator configured to be powered by a power supply voltage and to generate a regulated voltage, a bandgap reference circuit configured to be powered by the regulated voltage and to generate a bandgap reference voltage, a bias voltage generator configured to generate a plurality of selectable bias voltages based on the bandgap reference voltage, and a bias voltage selector configured to choose the first cascode bias voltage from amongst the plurality of selectable bias voltages.

In various embodiments, the cascode power amplifier includes a gain transistor and a first cascode transistor, the first cascode bias voltage configured to bias the first cascode transistor. According to a number of embodiments, the first cascode transistor is a field-effect transistor having a gate biased by the first cascode bias voltage. In accordance with several embodiments, the first cascode transistor is a bipolar transistor having a base biased by the first cascode bias voltage. According to some embodiments, the cascode power amplifier further includes a second cascode transistor biased by a second cascode bias voltage from the bias circuit, the bias voltage selector further configured to choose the second cascode bias voltage from amongst the plurality of selectable bias voltages.

In a number of embodiments, the bias voltage generator includes a low dropout regulator configured to generate a buffered bandgap voltage based on the bandgap voltage, and a first string of resistors connected between the buffered bandgap voltage and a ground voltage, the first string of resistors configured to generate at least a portion of the selectable bias voltages.

In several embodiments, the bias voltage selector is configured to receive a control signal for indicating which of the plurality of selectable bias voltages to choose as the first cascode bias voltage.

In some embodiments, the bias circuit is configured to bias the cascode power amplifier across two or more voltage levels of the power supply voltage, the two or more voltage levels associated with two or more power supply domains.

In a number of embodiments, the cascode power amplifier is configured to be powered by the power supply voltage.

In various embodiments, the coarse regulator includes only a single transistor.

In several embodiments, the coarse regulator does not include any differential amplifiers.

In certain embodiments, the present disclosure relates to a method of power amplifier biasing. The method includes generating a regulated voltage using a coarse regulator powered by a power supply voltage, generating a bandgap reference voltage using a bandgap reference circuit powered by the regulated voltage, generating a plurality of selectable bias voltages based on the bandgap reference voltage using a bias voltage generator, choosing a first cascode bias voltage from amongst the plurality of selectable bias voltages using a bias voltage selector, and biasing a cascode power amplifier using the first cascode bias voltage.

In various embodiments, the cascode power amplifier includes a gain transistor and a first cascode transistor, the method further includes biasing the first cascode transistor using the first cascode bias voltage. According to a number of embodiments, the first cascode transistor is a field-effect transistor having a gate biased by the first cascode bias voltage. In accordance with some embodiments, the first cascode transistor is a bipolar transistor having a base biased by the first cascode bias voltage. According to several embodiments, the cascode power amplifier further includes a second cascode transistor biased by a second cascode bias voltage, the method further including choosing the second cascode bias voltage from amongst the selectable bias voltages using the bias voltage selector.

In some embodiments, generating the plurality of selectable bias voltages further includes generating a buffered bandgap voltage based on the bandgap voltage, and generating at least a portion of the selectable bias voltages using a first string of resistors connected between the buffered bandgap voltage and a ground voltage.

In several embodiments, the method further includes choosing the first cascode bias voltage based on a control signal received over an interface.

In a number of embodiments, the method further includes operating the power supply voltage across two or more voltage levels associated with two or more power supply domains.

In some embodiments, the method further includes powering the cascode power amplifier using the power supply voltage.

In various embodiments, the coarse regulator includes only a single transistor.

In several embodiments, the coarse regulator does not include any differential amplifiers.

In certain embodiments, the present disclosure relates to a front end module. The front end module includes a package substrate and a semiconductor die attached to the package substrate. The semiconductor die includes a cascode power amplifier configured to amplify a radio frequency input signal and a bias circuit configured to generate at least a first cascode bias voltage operable to bias the cascode power amplifier. The bias circuit includes a coarse regulator configured to be powered by a power supply voltage and to generate a regulated voltage, a bandgap reference circuit configured to be powered by the regulated voltage and to generate a bandgap reference voltage, a bias voltage generator configured to generate a plurality of selectable bias voltages based on the bandgap reference voltage, and a bias voltage selector configured to choose the first cascode bias voltage from amongst the plurality of selectable bias voltages.

In some embodiments, the cascode power amplifier includes a gain transistor and a first cascode transistor, the first cascode bias voltage configured to bias the first cascode transistor. According to a number of embodiments, the first cascode transistor is a field-effect transistor having a gate biased by the first cascode bias voltage. In accordance with various embodiments, the first cascode transistor is a bipolar transistor having a base biased by the first cascode bias voltage. According to several embodiments, the cascode power amplifier further includes a second cascode transistor biased by a second cascode bias voltage from the bias circuit, the bias voltage selector further configured to choose the second cascode bias voltage from amongst the plurality of selectable bias voltages.

In a number of embodiments, the bias voltage generator includes a low dropout regulator configured to generate a buffered bandgap voltage based on the bandgap voltage, and a first string of resistors connected between the buffered bandgap voltage and a ground voltage, the first string of resistors configured to generate at least a portion of the plurality of selectable bias voltages.

In several embodiments, the bias voltage selector is configured to receive a control signal for indicating which of the plurality of selectable bias voltages to choose as the first cascode bias voltage.

In some embodiments, the bias circuit is configured to bias the cascode power amplifier across two or more voltage levels of the power supply voltage, the two or more voltage levels associated with two or more power supply domains.

In a number of embodiments, the cascode power amplifier is configured to be powered by the power supply voltage.

In various embodiments, the coarse regulator includes only a single transistor.

In several embodiments, the coarse regulator does not include any differential amplifiers.

In certain embodiments, the present disclosure relates to a mobile device. The mobile device includes a transceiver configured to generate a radio frequency input signal, and a front end system including a cascode power amplifier configured to amplify a radio frequency input signal and a bias circuit configured to generate at least a first cascode bias voltage operable to bias the cascode power amplifier. The bias circuit includes a coarse regulator configured to be powered by a power supply voltage and to generate a regulated voltage, a bandgap reference circuit configured to be powered by the regulated voltage and to generate a bandgap reference voltage, a bias voltage generator configured to generate a plurality of selectable bias voltages based on the bandgap reference voltage, and a bias voltage selector configured to choose the first cascode bias voltage from amongst the plurality of selectable bias voltages.

In various embodiments, the mobile device further includes an antenna configured to transmit a radio frequency output signal provided by the cascode power amplifier. According to a number of embodiments, the cascode power amplifier includes a gain transistor and a first cascode transistor, the first cascode bias voltage configured to bias the first cascode transistor. In accordance with several embodiments, the first cascode transistor is a field-effect transistor having a gate biased by the first cascode bias voltage. According to some embodiments, the first cascode transistor is a bipolar transistor having a base biased by the first cascode bias voltage. In accordance with several embodiments, the cascode power amplifier further includes a second cascode transistor biased by a second cascode bias voltage from the bias circuit, the bias voltage selector further configured to choose the second cascode bias voltage from amongst the plurality of selectable bias voltages.

In various embodiments, the bias voltage generator includes a low dropout regulator configured to generate a buffered bandgap voltage based on the bandgap voltage, and a first string of resistors connected between the buffered bandgap voltage and a ground voltage, the first string of resistors configured to generate at least a portion of the plurality of selectable bias voltages.

In several embodiments, the bias voltage selector is configured to receive a control signal for indicating which of the plurality of selectable bias voltages to choose as the first cascode bias voltage.

In a number of embodiments, the bias circuit is configured to bias the cascode power amplifier across two or more voltage levels of the power supply voltage, the two or more voltage levels associated with two or more power supply domains.

In several embodiments, the cascode power amplifier is configured to be powered by the power supply voltage.

In various embodiments, the coarse regulator includes only a single transistor.

In a number of embodiments, the coarse regulator does not include any differential amplifiers.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
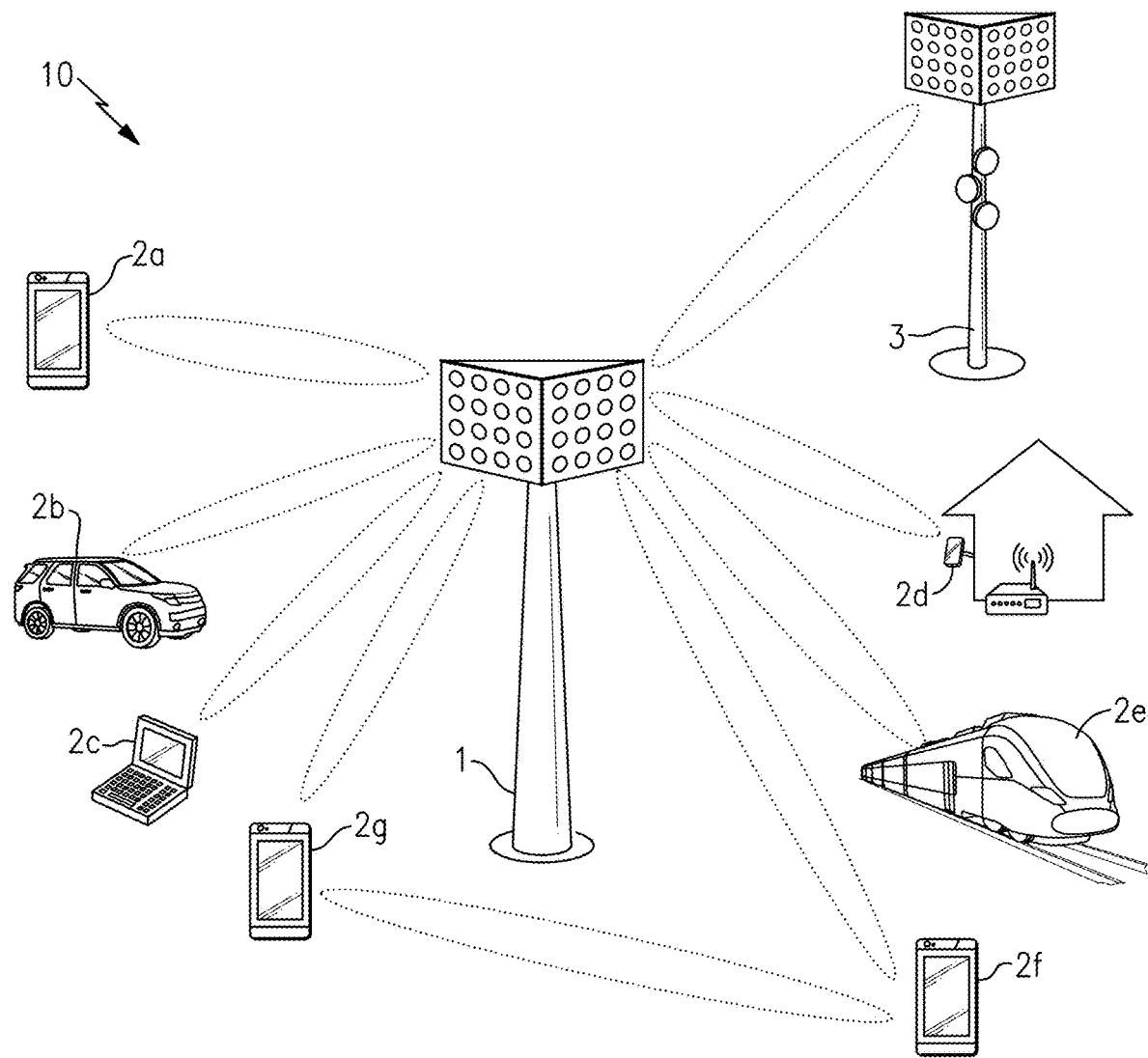
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
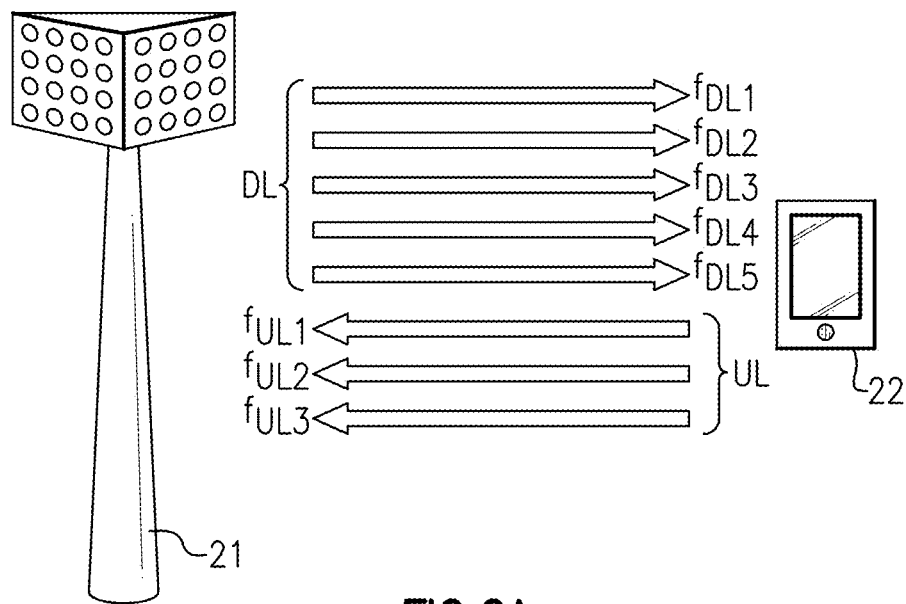
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
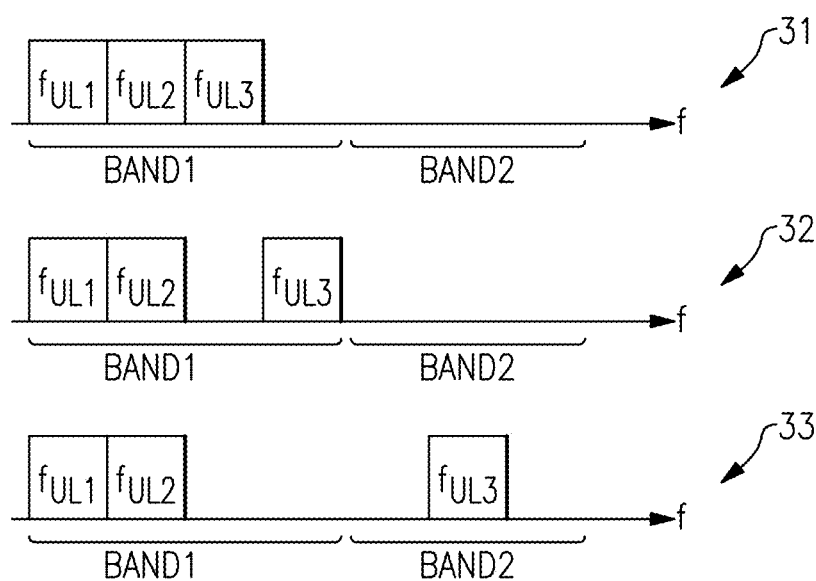
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
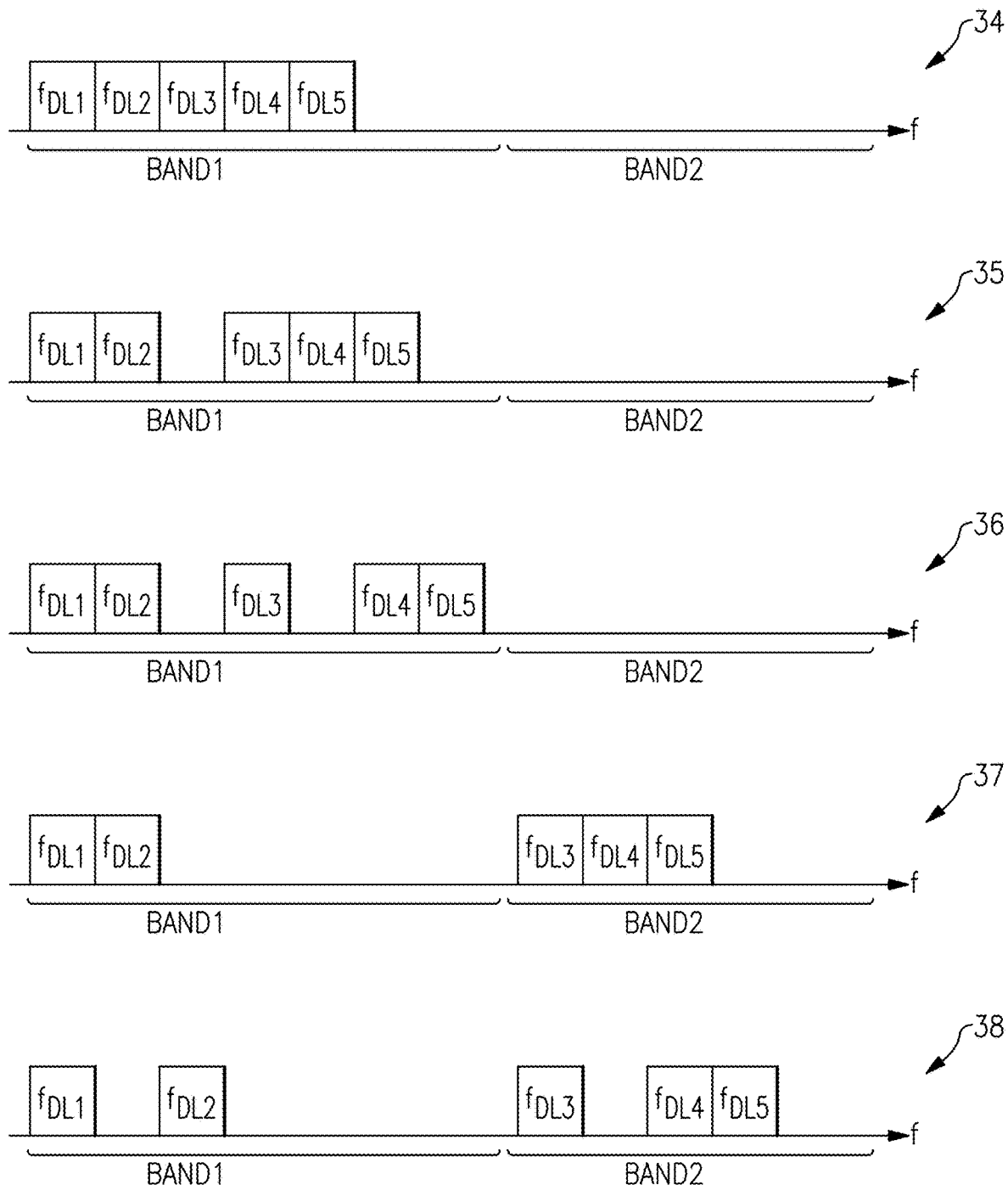
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
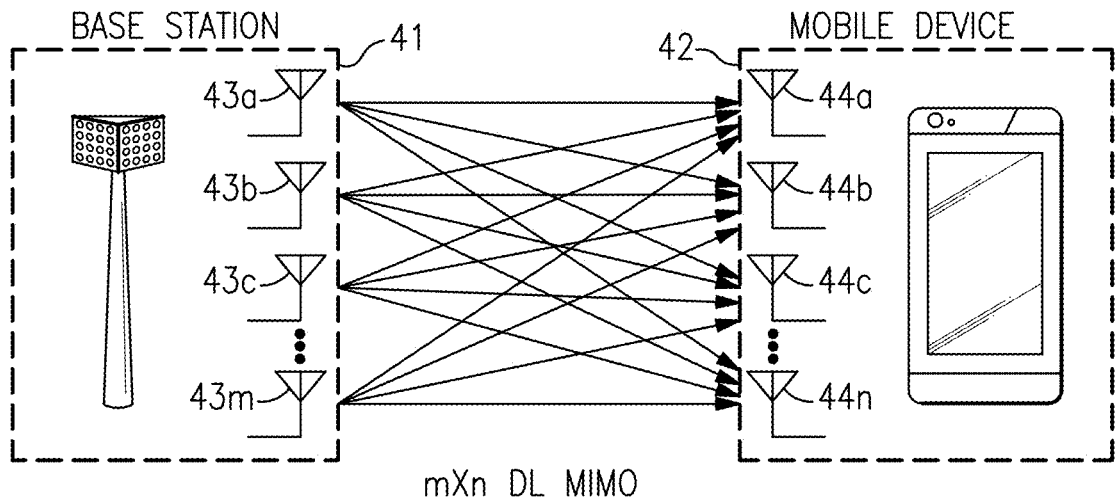
FIG. 3A is a schematic diagram of one example of a downlink channel using multi-input and multi-output (MIMO) communications.
Figure 3B:
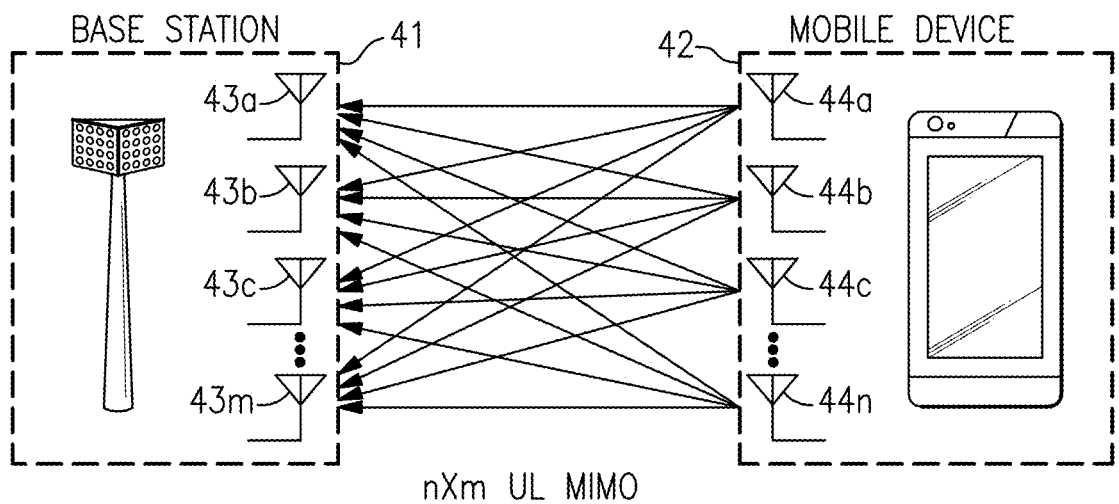
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43$a$, 43$b$, 43$c$, . . . 43$m$ of the base station 41 and receiving using N antennas 44$a$, 44$b$, 44$c$, . . . 44$n$ of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44$a$, 44$b$, 44$c$, . . . 44$n$ of the mobile device 42 and receiving using M antennas 43$a$, 43$b$, 43$c$, . . . 43$m$ of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
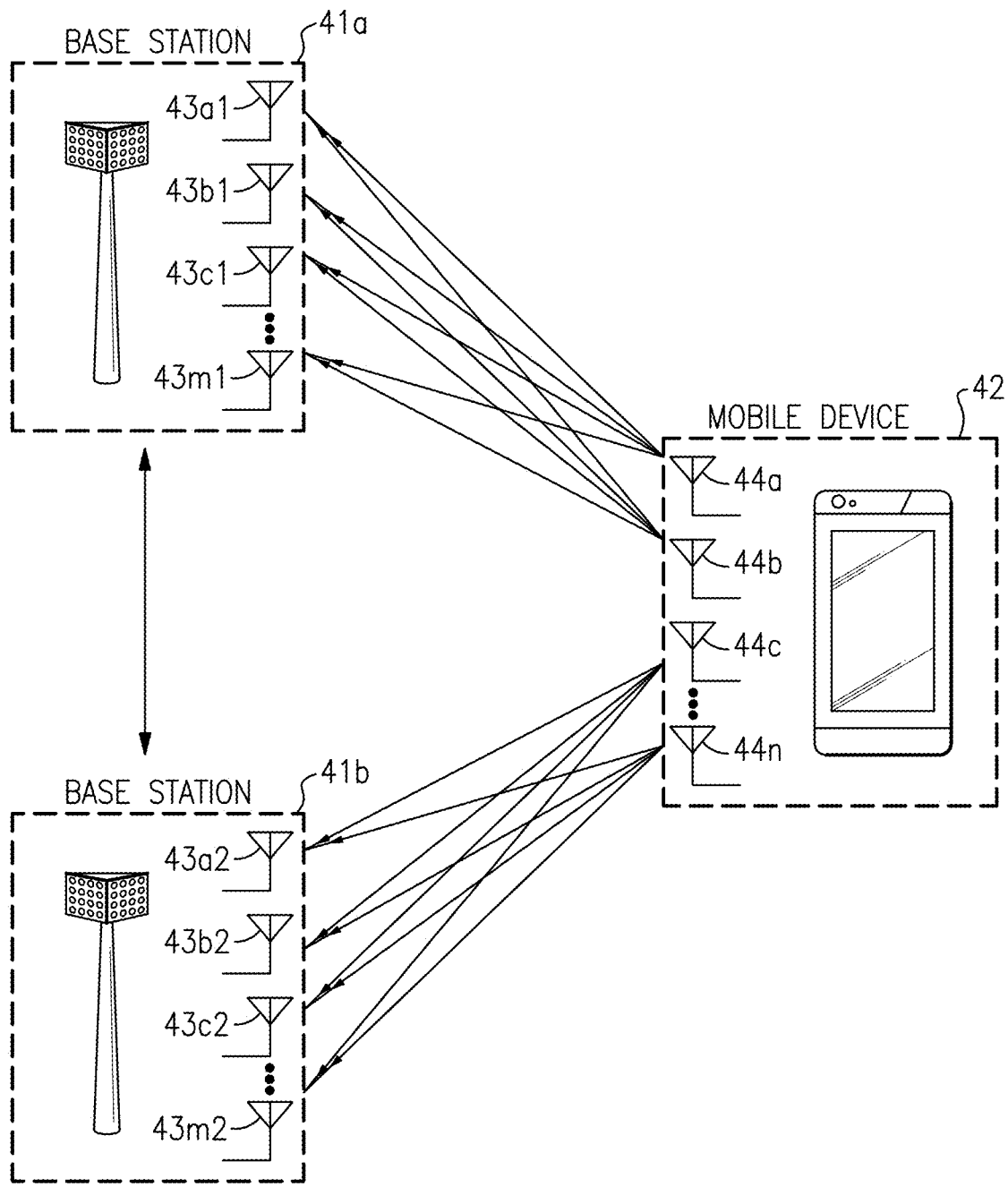
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44$a$, 44$b$, 44$c$, . . . 44$n$ of the mobile device 42. Additional a first portion of the uplink transmissions are received using M antennas 43$a$1, 43$b$1, 43$c$1, . . . 43$m$1 of a first base station 41$a$, while a second portion of the uplink transmissions are received using M antennas 43$a$2, 43$b$2, 43$c$2, . . . 43$m$2 of a second base station 41$b$. Additionally, the first base station 41$a$ and the second base station 41$b$ communication with one another over wired, optical, and/or wireless links.

The MIMO scenario of FIG. 3C illustrates an example in which multiple base stations cooperate to facilitate MIMO communications.

Figure 4A:
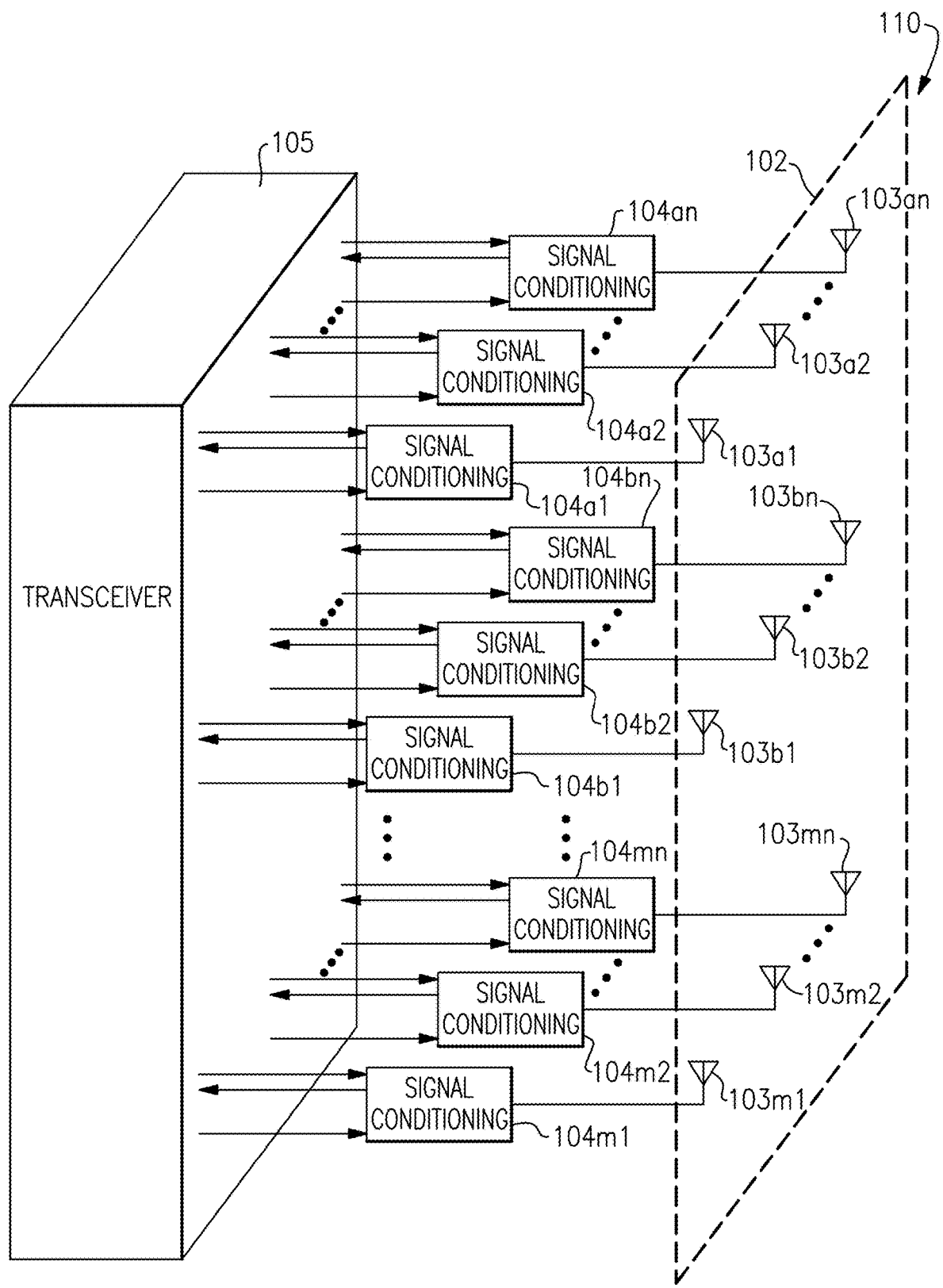
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits 104$a$1, 104$a$2 . . . 104$an$, 104$b$1, 104$b$2 . . . 104$bn$, 104$m$1, 104$m$2 . . . 104$mn$, and an antenna array 102 that includes antenna elements 103$a$1, 103$a$2 . . . 103$an$, 103$b$1, 103$b$2 . . . 103$bn$, 103$m$1, 103$m$2 . . . 103$mn$.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
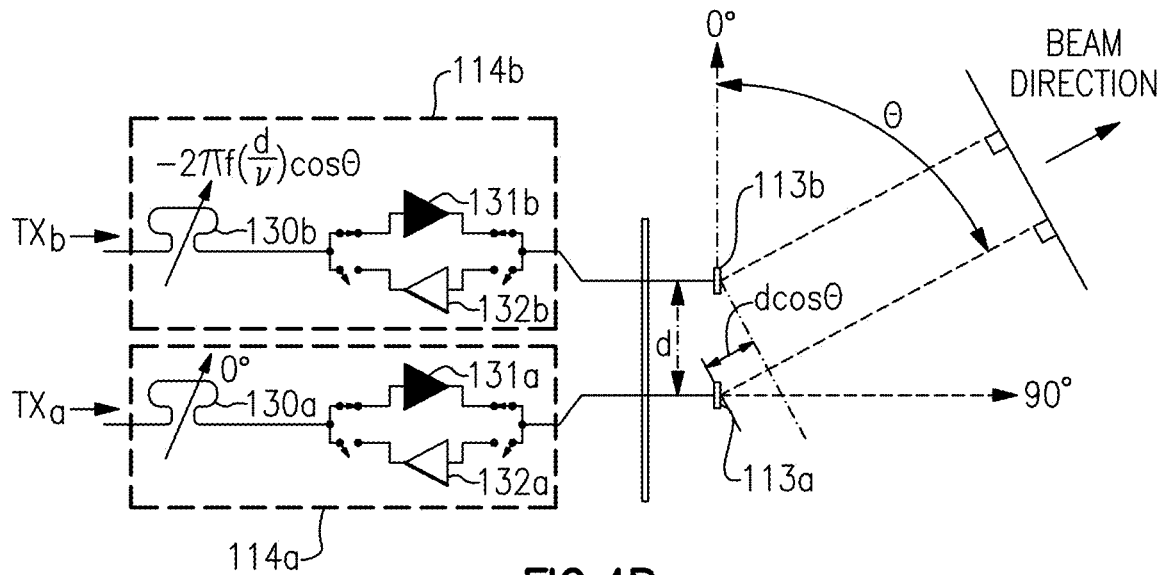
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114$a$, a second signal conditioning circuit 114$b$, a first antenna element 113$a$, and a second antenna element 113$b$.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114$a$ includes a first phase shifter 130$a$, a first power amplifier 131$a$, a first low noise amplifier (LNA) 132$a$, and switches for controlling selection of the power amplifier 131$a$ or LNA 132$a$. Additionally, the second signal conditioning circuit 114$b$ includes a second phase shifter 130$b$, a second power amplifier 131$b$, a second LNA 132$b$, and switches for controlling selection of the power amplifier 131$b$ or LNA 132$b$.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113$a$ and the second antenna element 113$b$ are separated by a distance d. Additionally, FIG. 4B has been annotated with an angle Θ, which in this example has a value of about 90 when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle Θ can be achieved. For example, when the first phase shifter 130a has a reference value of 0°, the second phase shifter 130b can be controlled to provide a phase shift of about $-2\pi f(d/v)\cos \Theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi \cos \Theta$ radians to achieve a transmit beam angle Θ.

Accordingly, the relative phase of the phase shifters 130a, 130b can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
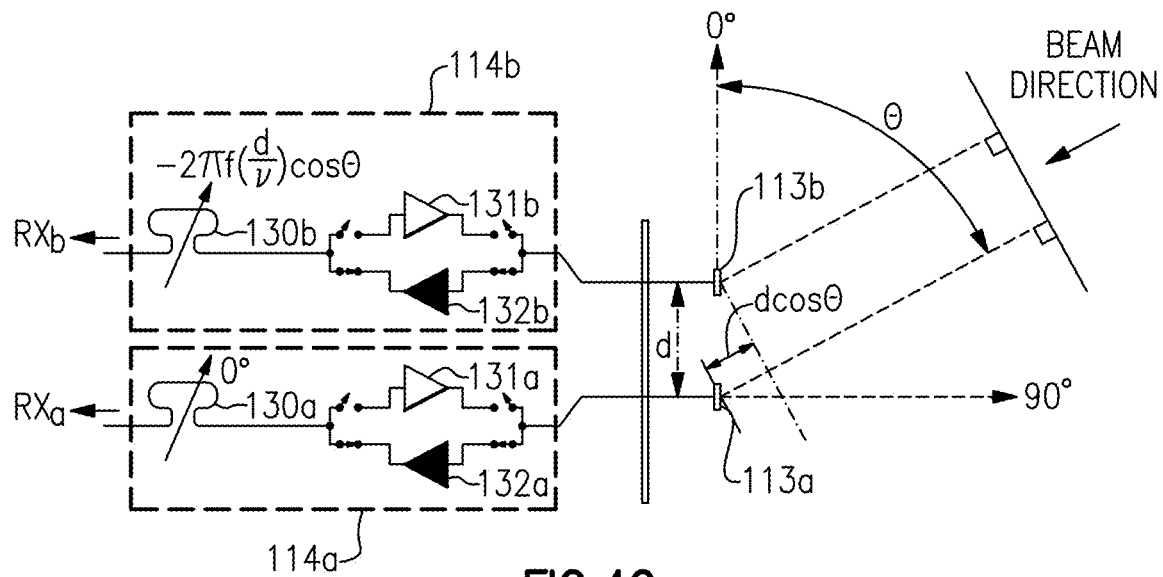
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130a and the second phase shifter 130b can be selected to about equal to $-2\pi f(d/v)\cos \Theta$ radians to achieve a desired receive beam angle Θ. In implementations in which the distance d corresponds to about ½λ, the phase difference can be selected to about equal to $-\pi \cos \Theta$ radians to achieve a receive beam angle Θ.

Although various equations for phase values to provide beamforming have been provided, other phase selection values are possible, such as phase values selected based on implementation of an antenna array, implementation of signal conditioning circuits, and/or a radio environment.

Biasing of Cascode Power Amplifiers for Multiple Power Supply Domains

Provided herein are cascode power amplifier bias circuits suitable for operating across multiple power supply domains. In certain embodiments, a power amplifier system includes a cascode power amplifier and a multi-domain bias circuit that generates at least a first cascode bias voltage for the cascode power amplifier. The multi-domain bias circuit includes a coarse regulator that generates a regulated voltage based on a power supply voltage that is operable with multiple voltage levels associated with different power supply domains, a bandgap reference circuit that is powered by the regulated voltage and outputs a bandgap reference voltage, a bias voltage generator that generates multiple selectable bias voltages based on the bandgap reference voltage, and a bias voltage selector that chooses the first cascode bias voltage from amongst the selectable bias voltages.

By implementing the multi-domain bias circuit in this manner, biasing of the cascode power amplifier is properly maintained even as the voltage level of the power supply voltage changes.

In certain implementations, the cascode power amplifier is also powered by the power supply voltage. Thus, the multi-domain bias circuit and the cascode power amplifier can both be powered by the power supply voltage, which can operate with different voltage levels based on application and/or operating scenario. Thus, the multi-domain bias circuit serves to generate suitable cascode bias voltage(s) in a wide range of deployment scenarios associated with different power supply domains. Accordingly, the multi-domain bias circuit avoids a need for custom designs targeted for a particular power supply domain and/or reduces or eliminates constraints on power supply voltage.

The cascode power amplifier can be implemented in a wide variety of ways, including, but not limited to, using field-effect transistor (FET) and/or bipolar transistor implementations including one cascode transistor, two cascode transistors, or three or more cascode transistors. In certain implementations, the cascode bias voltage(s) generated by the multi-domain bias circuit serve to bias gate(s) and/or base(s) of cascode transistors of the cascode power amplifier.

In certain implementations, the multi-domain bias circuit is included on a semiconductor die of a front end system. Additionally, the multi-domain bias circuit provides cascode bias voltages in applications with multiple power supply voltage domains, for instance, high performance front end modules for millimeter wave (mmW) communications.

Thus, multi-domain bias circuit can serve a wide variety of applications, including complex eFEM applications utilizing mmW frequencies. For example, certain eFEM applications desire a high output power/high linearity power amplifier (for instance, a cascode power amplifier fabricated in SOI CMOS) operating with high power supply voltage (for instance, 2.5V+/−10% in a first domain or 3.3 V+/−10% in a second domain), high speed/low power digital circuitry (for instance, a serial interface and decoders) operating with a low power supply voltage (for instance, 1.2V+/−10% or 1.0V+/−10%), high performance analog circuits operating with a moderate power supply voltage (for instance, 1.8 V+/−10%), and high precision biasing voltage/current generators for power amplifier tuning. The multi-domain bias circuits herein can be utilized in such eFEM applications as well as in other applications and operating scenarios.

Figure 5:
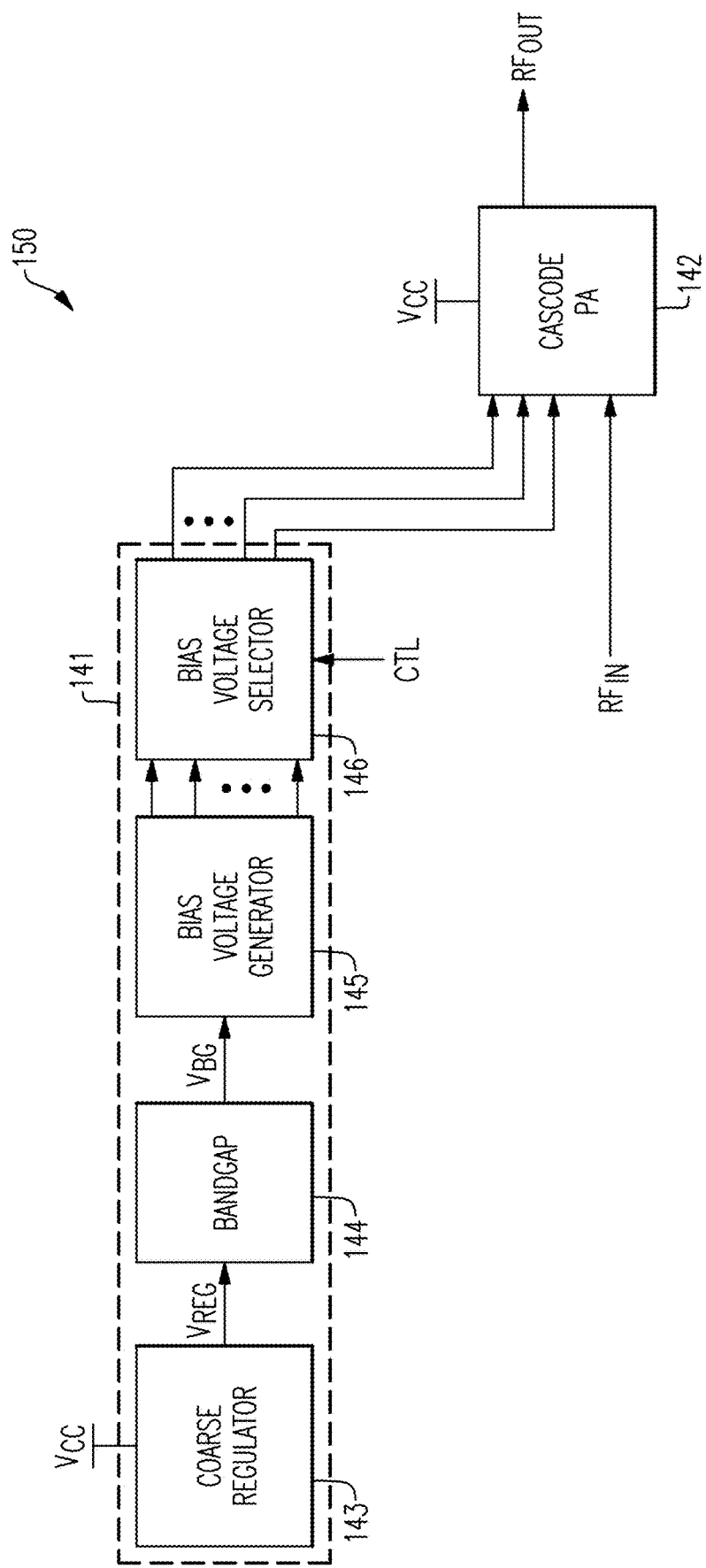
FIG. 5 is a schematic diagram of a power amplifier system according to one embodiment.

FIG. 5 is a schematic diagram of a power amplifier system 150 according to one embodiment. The power amplifier system 150 includes a multi-domain bias circuit 141 and a cascode power amplifier 142.

As shown in FIG. 5, the cascode power amplifier 142 amplifies an RF input signal $RF_{IN}$ to generate an RF output signal $RF_{OUT}$. Additionally, the cascode power amplifier 142 is powered by a power supply voltage $V_{CC}$, and receives multiple cascode bias voltages from the multi-domain bias circuit 141. Although FIG. 5 depicts the cascode power amplifier 142 as receiving three cascode bias voltages, the cascode power amplifier 142 can receive more or fewer cascode bias voltages as indicated by the ellipses.

In the illustrated embodiment, the multi-domain bias circuit 141 includes a coarse regulator 143, a bandgap reference circuit 144, a bias voltage generator 145, and a bias voltage selector 146.

As shown in FIG. 5, the coarse regulator 143 receives the power supply voltage $V_{CC}$ and outputs a coarse regulated voltage $V_{REG}$. Thus, the coarse regulator 143 and the cascode power amplifier 142 are powered by a common power supply, in this embodiment. The power supply voltage $V_{CC}$ is operable at different voltage levels associated with different power supply domains desired for a particular application and/or operating scenario.

In certain implementations, the coarse regulator 143 does not include any differential amplifiers, such as operational amplifiers (op-amps). Thus, the coarse regulator 143 can be implemented with a compact area and operate over a wide voltage range to support operation of the power supply voltage $V_{CC}$ across multiple power supply domains.

With continuing reference to FIG. 5, the bandgap reference circuit 144 receives the coarse regulated voltage $V_{REG}$ and outputs a bandgap reference voltage $V_{BG}$. Additionally, the bias voltage generator 145 receives the bandgap reference voltage $V_{BG}$ and generates multiple selectable bias voltages. In certain implementations, the bias voltage generator 145 generates the selectable bias voltages based on outputting different ratios or fractions of the bandgap reference voltage $V_{BG}$. Since the bandgap reference voltage $V_{BG}$ exhibits robust temperature stability, the selectable bias voltages are also stable across temperature.

In the illustrated embodiment, the bias voltage selector 146 receives a control signal CTL, and outputs one or more cascode bias voltages chosen from the selectable bias voltages based on the control signal CTL. Thus, the control signal CTL indicates which particular selectable bias voltage(s) to output as the cascode bias voltage(s).

Thus, the bias voltage generator 145 generates multiple selectable bias voltages that are substantially constant across temperature, while the bias voltage selector 146 chooses which of the selectable bias voltage(s) serve as the cascode bias voltage(s). Accordingly, enhanced flexibility and/or operation over extended power supply voltage range and temperature range is achieved.

Figure 6:
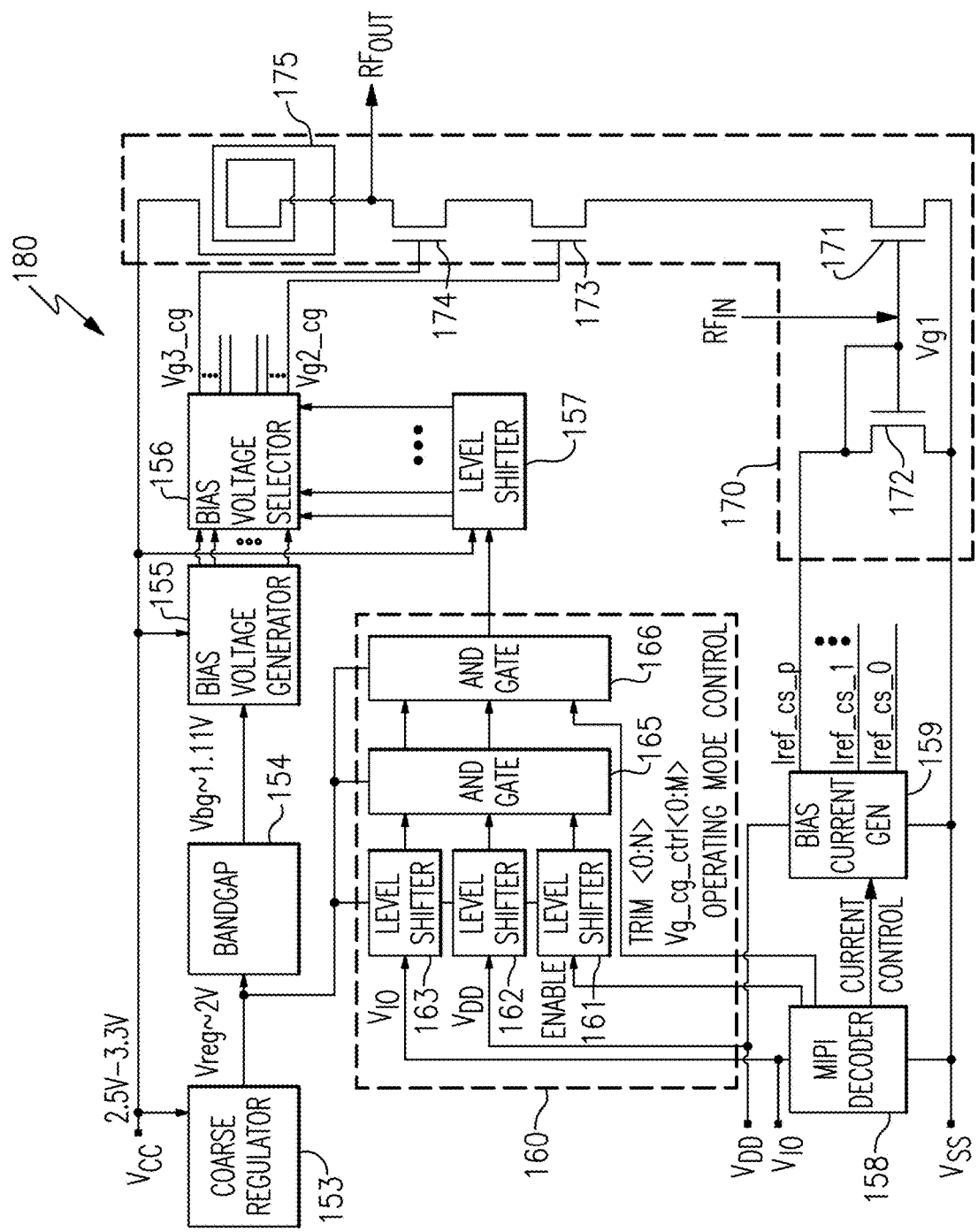
FIG. 6 is a schematic diagram of a power amplifier system according to another embodiment.

FIG. 6 is a schematic diagram of a power amplifier system 180 according to another embodiment. The power amplifier system 180 includes a cascode power amplifier 170 and a multi-domain bias circuit including a coarse regulator 153, a bandgap reference circuit 154, a bias voltage generator 155, a bias voltage selector 156, a level shifter 157, a Mobile Industry Processor Interface (MIPI) decoder 158, a bias current generator 159, and an operating mode control circuit 160.

In the illustrated embodiment, the coarse regulator 153 receives a power supply voltage $V_{CC}$ that is operable across multiple power supply domains including at least a 2.5V domain and a 3.3V domain. The coarse regulator 153 generates a coarse regulated voltage Vreg of about 2V, in this example. The bandgap reference circuit 154 receives the coarse regulated voltage Vreg and outputs a bandgap reference voltage Vbg of about 1.11V, in this example.

With continuing reference to FIG. 6, the bias voltage generator 155 is powered by the power supply voltage $V_{CC}$. Additionally, the bias voltage generator 155 uses the bandgap reference voltage Vbg to generate multiple selectable bias voltages that are provided to the bias voltage selector 156. The bias voltage selector 156 choses amongst the selectable bias voltages to generate a first cascode gate bias voltage Vg2_cg and a second cascode gate bias voltage Vg3_cg. The particular bias voltages chosen by the bias voltage selector 156 are chosen based on control signals from the level shifter 157.

The MIPI decoder 158 processes data received over a serial interface (for instance, a MIPI radio frequency front end (RFFE) bus) to generate control signals for the operating mode control circuit 160 and the bias current generator 159. For example, the MIPI decoder 158 generates a current control signal for selecting amongst multiple reference currents Iref_cs_0, Iref_cs_1, . . . Iref_cs_p for providing to an input current mirror of the cascode power amplifier 170. Additionally, the MIPI decoder 158 generates a cascode bias selection control signal Vg_cg_ctrl<0:M> for selecting the cascode bias voltages, a trim control signal <0:N> for compensating the selection of the cascode bias voltages by providing trimming, and an enable signal ENABLE for enabling the cascode power amplifier 170 (by way of biasing the cascode power amplifier 170 to a disabled state). As shown in FIG. 6, the MIPI decoder 158 is powered by an input/output (I/O) power supply voltage $V_{IO}$ and the bias current generator 159 is powered by a low voltage power supply voltage $V_{DD}$.

In the illustrated embodiment, the operating mode control circuit 160 includes a first level shifter 161 for level shifting the enable signal ENABLE, a second level shifter 162 for level shifting the low voltage power supply voltage $V_{DD}$, a third level shifter 163 for level shifting the I/O power supply voltage $V_{IO}$, and a first digital logic circuit 165 for performing an AND operation on the outputs of the level shifters 161-163. The first digital logic circuit 165 serves to detect when the enable signal ENABLE is active and both the low voltage power supply voltage $V_{DD}$ and the I/O power supply voltage $V_{IO}$ are present (for instance, detecting presence of power supply voltages applied to power supply pins of an integrated circuit on which the power amplifier system 180 is fabricated). The operating mode control circuit 160 further includes a second digital logic circuit 166 for processing the cascode bias selection control signal Vg_cg_ctrl<0:M> and the trim control signal <0:N> based on the output of the first digital logic circuit 165. For example, the second digital logic circuit 166 can include an array of AND gates for gating individual bits of the cascode bias selection control signal Vg_cg_ctrl<0:M> and the trim control signal <0:N> based on the output of the first digital logic circuit 165.

As shown in FIG. 6, the operating mode control circuit 160 is powered by the coarse regulated voltage Vreg, and serves to provide control signals to the input of the level shifter 157, which is powered by the power supply voltage $V_{CC}$.

In the illustrated embodiment, the cascode power amplifier 170 includes a gain transistor 171, a first cascode transistor 173, and a second cascode transistor 174 that are connected in series and biased to operate as a double stack cascode amplifier. The cascode power amplifier 170 is implemented using FETs (for instance, silicon on insulator (SOI) metal oxide semiconductor (MOS) transistors), in this example. The cascode power amplifier receives the power supply voltage $V_{CC}$ and a ground voltage $V_{SS}$.

The cascode power amplifier 170 further includes a bias transistor 172 with connected the gain transistor 171 to form an input current mirror. The bias transistor 172 receives the selected bias current from the bias current generator 159 to thereby control a gate bias voltage Vg1 at the gate of the gain transistor 171, thereby setting a bias current flowing through the cascode power amplifier 170. The cascode power amplifier 170 further includes a choke inductor 175 that provides the power supply voltage $V_{CC}$ to a drain of the second cascode transistor 174. As shown in FIG. 6, the gate of the gain transistor 171 receives an RF input signal $RF_{IN}$, and the drain of the second cascode transistor 174 provides an RF output signal $RF_{OUT}$.

In the illustrated embodiment, the bias voltage selector 156 provides the first cascode gate bias voltage Vg2_cg to the gate of the first cascode transistor 173 and provides the second cascode gate bias voltage Vg3_cg to the gate of the second cascode transistor 174.

Figure 7A:
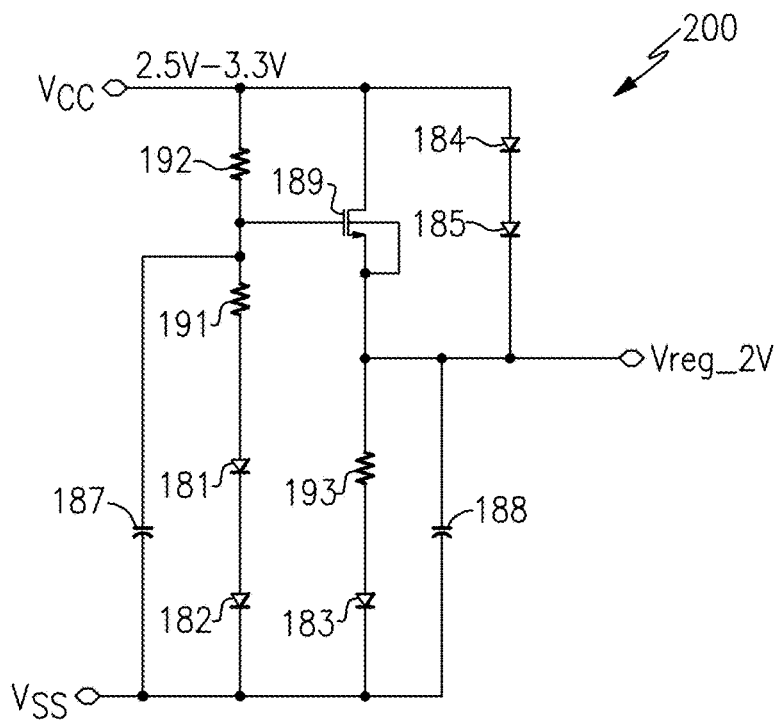
FIG. 7A is a schematic diagram of a coarse regulator according to one embodiment.

FIG. 7A is a schematic diagram of a coarse regulator 200 according to one embodiment. The coarse regulator 200 includes a first diode 181, a second diode 182, a third diode 183, a fourth diode 184, a fifth diode 185, a first capacitor 187, a second capacitor 188, a FET 189 (n-type, in this example), a first resistor 191, a second resistor 192, and a third resistor 193. The coarse regulator 200 receives the power supply voltage $V_{CC}$ and ground $V_{SS}$, and generates a coarse regulated voltage Vreg_2V of about 2V.

The coarse regulator 200 of FIG. 7A illustrates one embodiment of the coarse regulator 153 of FIG. 6. However, the teachings herein are applicable to coarse regulators implemented in other ways.

In the illustrated embodiment, the coarse regulator 200 operates without any differential amplifier (for instance, with no operational amplifiers) and includes only a single transistor, thereby achieving compact area and operability over a wide voltage range of the power supply voltage $V_{CC}$.

Figure 7B:
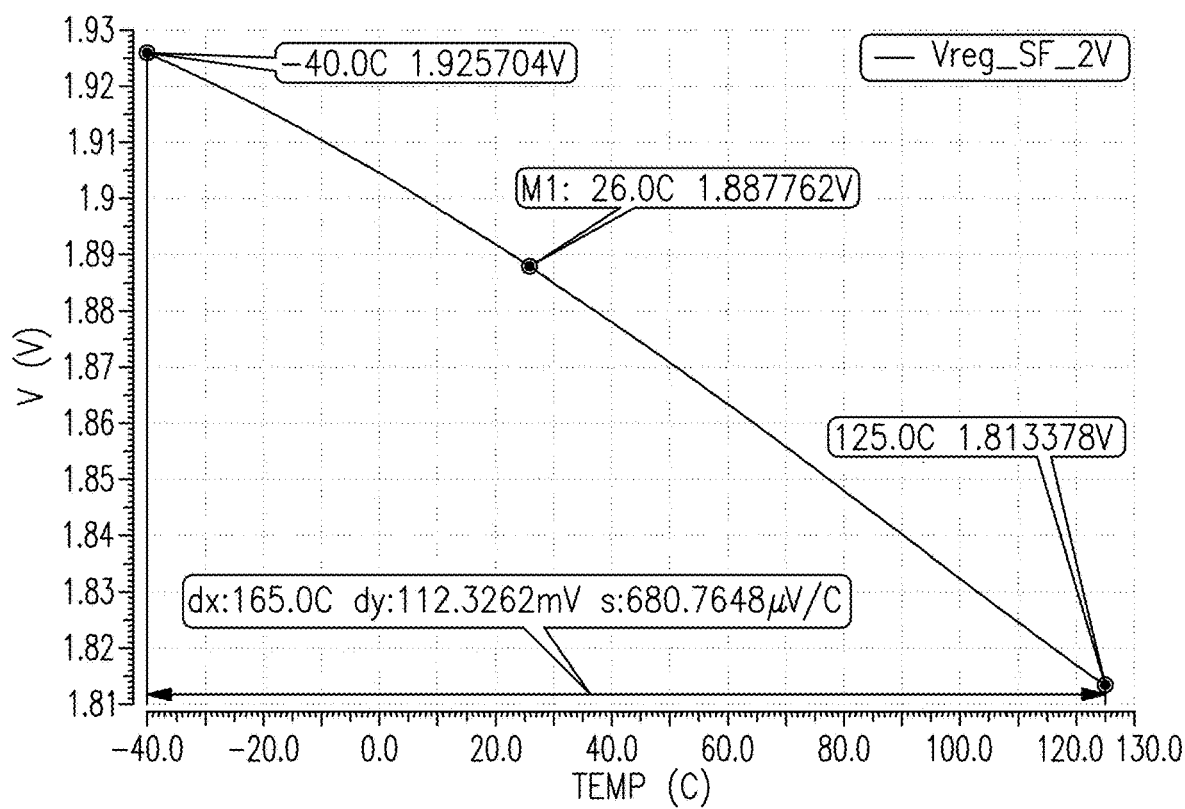
FIG. 7B is a graph of one example of a coarse regulated voltage versus temperature.

FIG. 7B is a graph of one example of a coarse regulated voltage versus temperature for the coarse regulator 200 of FIG. 7A. In the example of FIG. 7B, the coarse regulator 200 outputs a coarse regulated voltage ranging between about 1.81V and about 1.93V over a temperature range between −40° C. and 125° C.

Figure 8A:
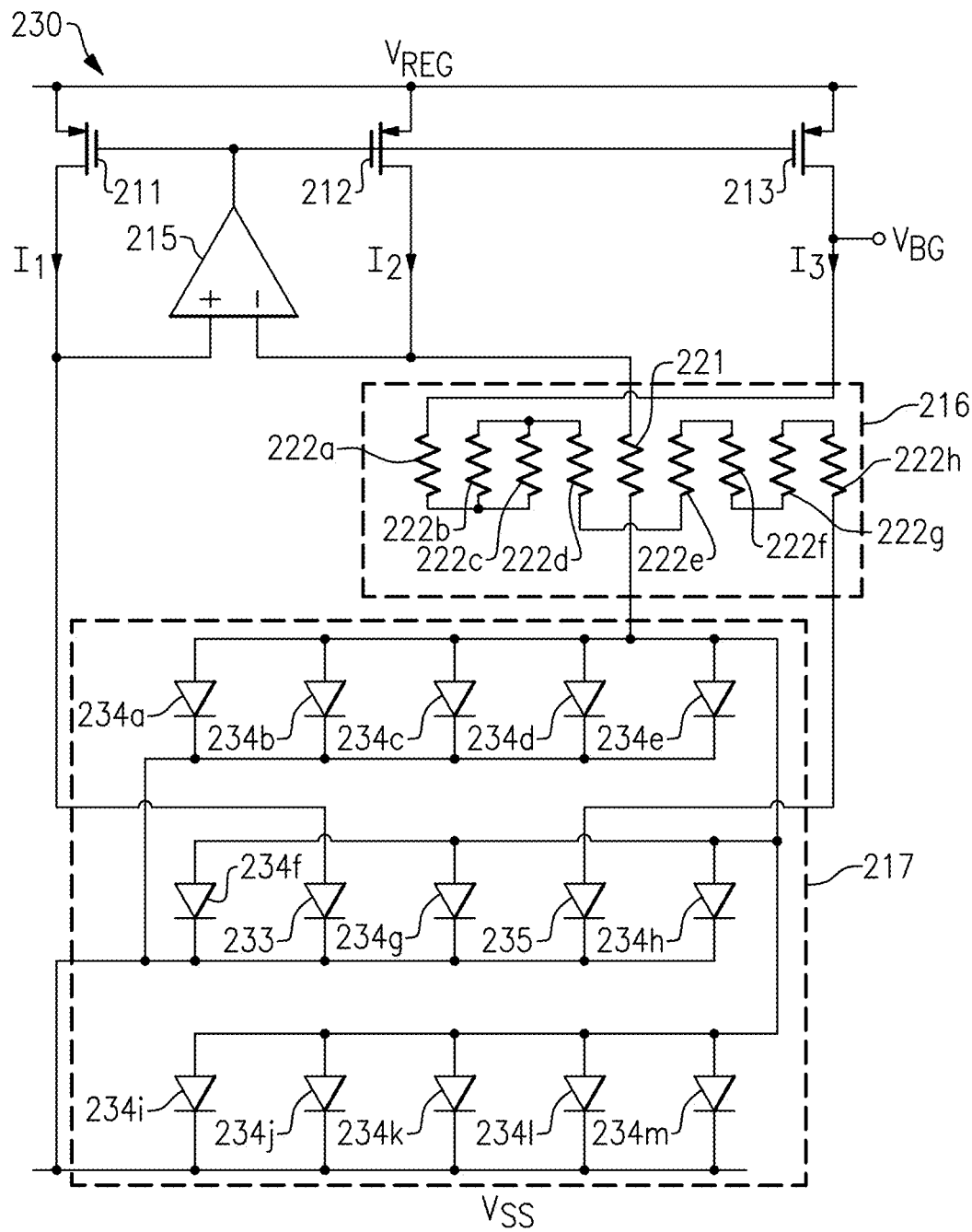
FIG. 8A is a schematic diagram of a bandgap reference circuit according to one embodiment.

FIG. 8A is a schematic diagram of a bandgap reference circuit 230 according to one embodiment. The bandgap reference circuit 230 includes a first PFET 211, a second PFET 212, a third PFET 213, a differential amplifier 215, a resistor array 216, and a diode array 217. The bandgap reference circuit 230 receives a coarse regulated voltage $V_{REG}$ and a ground voltage $V_{SS}$, and generates a bandgap reference voltage $V_{BG}$.

The bandgap reference circuit 230 of FIG. 8A illustrates one embodiment of the bandgap reference circuit 154 of FIG. 6. However, the teachings herein are applicable to bandgap reference circuits implemented in other ways.

In the illustrated embodiment, the resistor array 216 includes an array of nine resistor elements including one resistor element 221 serving as a resistor R1 and eight resistor elements 222a-222h serving as a resistor R2, with R1:R2=1:N.

As shown in FIG. 8A, the diode array 217 includes an array of fifteen diode elements including one diode element 233 serving as a diode D1, thirteen diode elements 234a-234m serving as a diode D2, and one diode element 235 serving as a diode D3, with D1:D2:D3=1:13:1.

The differential amplifier 215 operates with feedback to control the gate voltages of PFETs 211-213, thereby controlling the currents flowing therethrough. In the illustrated embodiment, $I_1:I_2:I_3=1:1:1$.

Figure 8B:
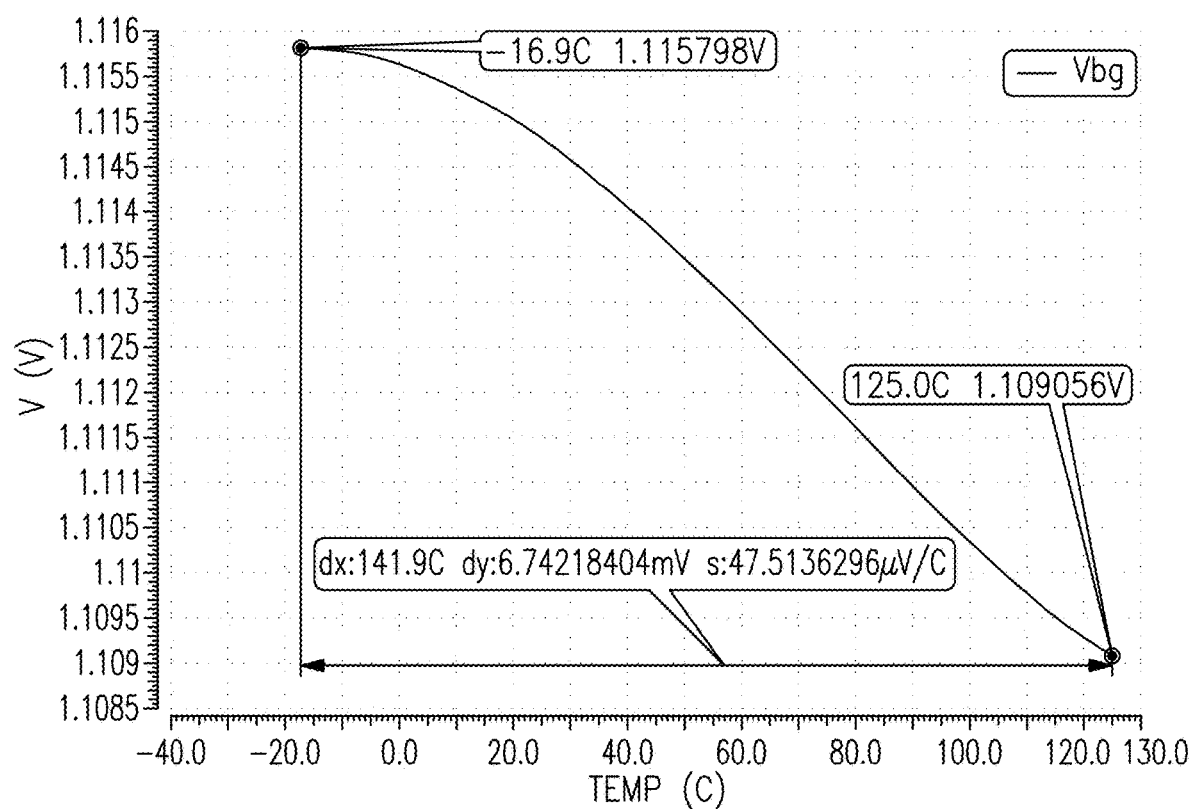
FIG. 8B is a schematic diagram of one example of a bandgap reference voltage versus temperature.

FIG. 8B is a schematic diagram of one example of a bandgap reference voltage versus temperature for the bandgap reference circuit 230 of FIG. 8A. In the example of FIG. 8B, the bandgap reference circuit 230 outputs a reference voltage of about 1110 mV with very low temperature coefficient over a temperature range between −40° C. and 125° C.

Figure 9A:
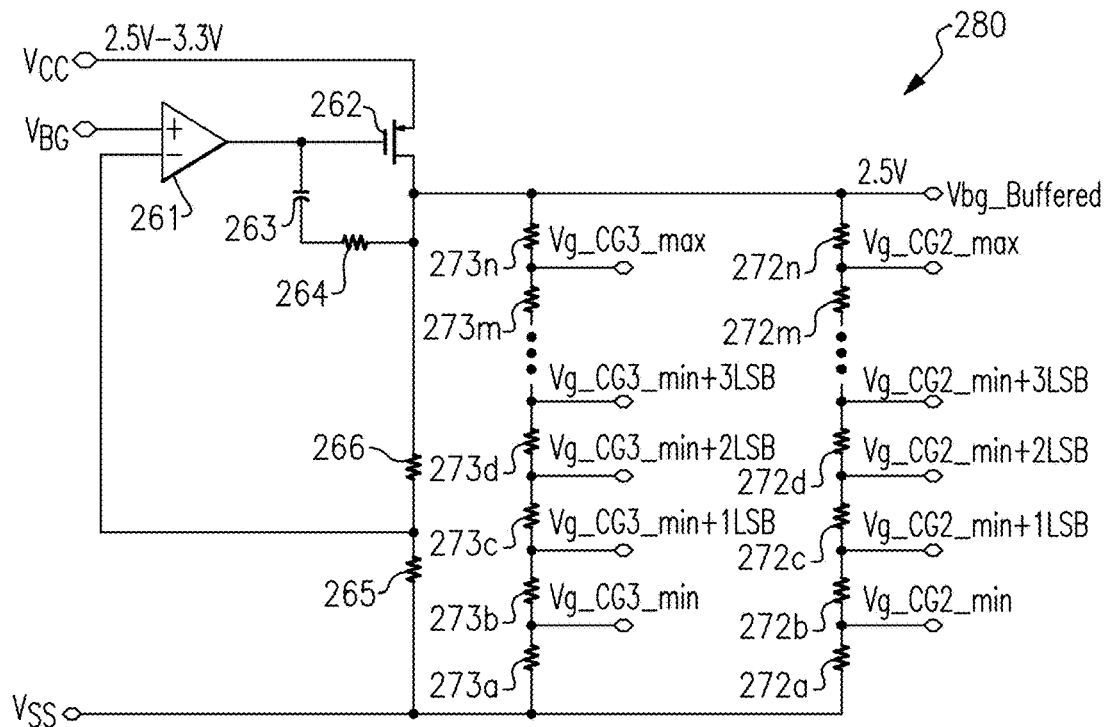
FIG. 9A is a schematic diagram of a bias voltage generator according to one embodiment.

FIG. 9A is a schematic diagram of a bias voltage generator 280 according to one embodiment. The bias voltage generator 280 receives a bandgap voltage $V_{BG}$ as an input, and is powered by a power supply voltage $V_{CC}$ and a ground voltage $V_{SS}$. The bias voltage generator 280 generates various bias voltages as discussed below.

The bias voltage generator 280 of FIG. 9A illustrates one embodiment of the bias voltage generator 155 of FIG. 6. However, the teachings herein are applicable to bias voltage generators implemented in other ways.

In the illustrated embodiment, the bias voltage generator 280 includes a differential amplifier 261 (for instance, an operational amplifier) a regulator FET 262, a compensation capacitor 263, a compensation resistor 264, a first feedback resistor 265, and a second feedback resistor 266 that are connected as a low dropout (LDO) regulator. The LDO regulator serves to generate a buffered bandgap voltage Vbg_Buffered that has a ratio relative to the bandgap voltage $V_{BG}$. The ratio of the buffered bandgap voltage Vbg_Buffered to the bandgap voltage $V_{BG}$ is controlled based on the ratio of the first feedback resistor 265 to the second feedback resistor 266. In certain implementations, the first feedback resistor 265 and/or the second feedback resistor 266 are controllable (for instance, digitally programmable using data received over a chip interface) to provide flexibility in setting the voltage level of the buffered bandgap voltage Vbg_Buffered.

As shown in FIG. 9A, the bias voltage generator 280 further includes a first string of resistors 272a, 272b, 272c, 272d, . . . 272m, 272n that is connected between the buffered bandgap voltage Vbg_Buffered and ground $V_{SS}$. The first string of resistors operates as a voltage divider that generates a first group of selectable bias voltages Vg_CG2_min, Vg_CG2_min+1LSB, Vg_CG2_min+2LSB, Vg_CG2_min+3LSB, . . . , Vg_CG2_max. The bias voltage generator 280 further includes a second string of resistors 273a, 273b, 273c, 273d, . . . 273m, 273n that is connected between the buffered bandgap voltage Vbg_Buffered and ground $V_{SS}$. The second string of resistors operates as a voltage divider that generates a second group of selectable bias voltages Vg_CG3_min, Vg_CG3_min+1LSB, Vg_CG3_min+2LSB, Vg_CG3_min+3LSB, . . . , Vg_CG3_max.

Figure 9B:
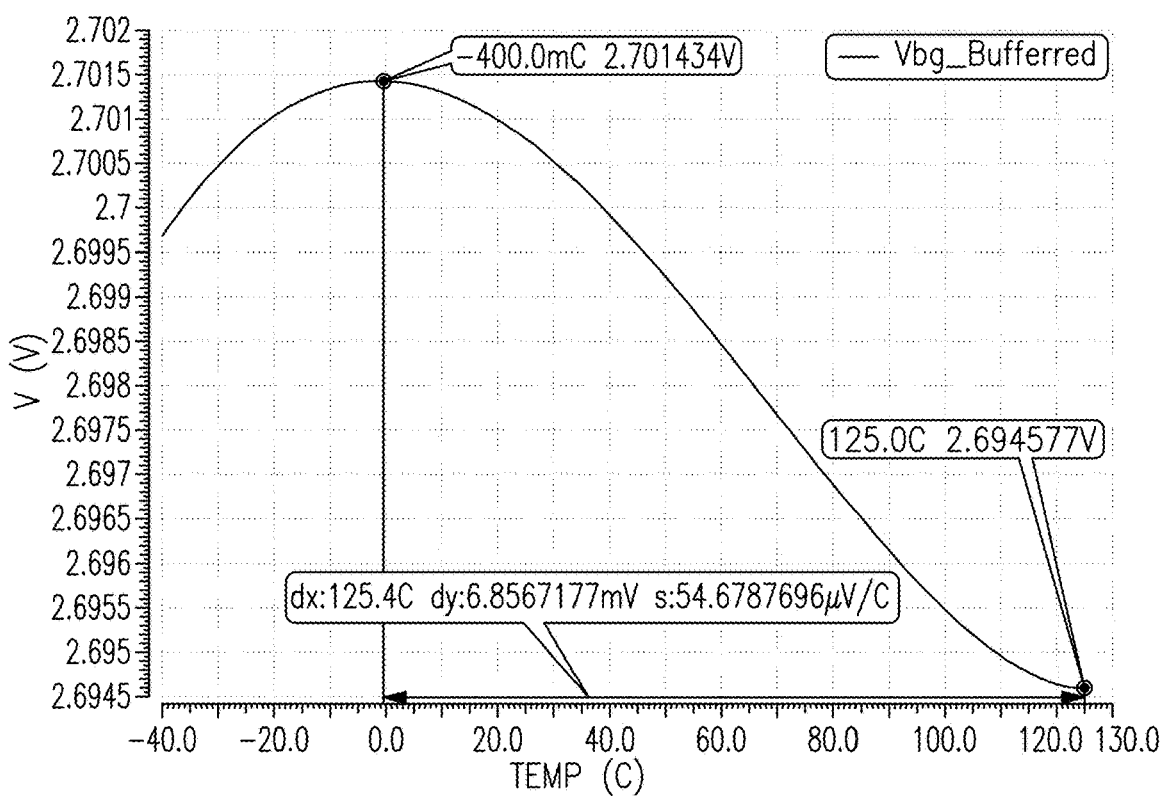
FIG. 9B is a graph of one example of a buffered bandgap reference voltage versus temperature.

FIG. 9B is a graph of one example of a buffered bandgap reference voltage versus temperature for the bias voltage generator 280 of FIG. 9A. The graph depicts the buffered bandgap voltage Vbg_Buffered over a temperature range between −40° C. and 125° C.

Figure 10:
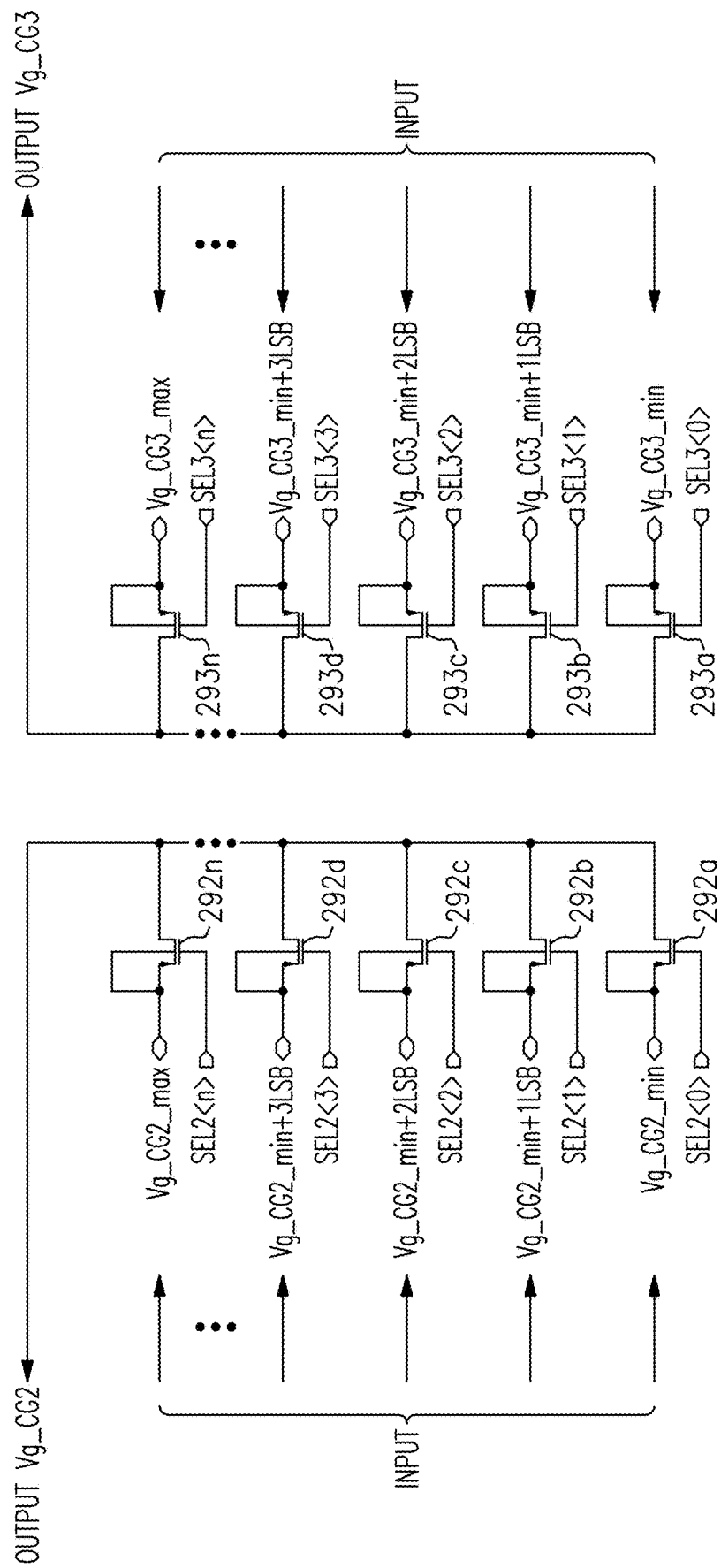
FIG. 10 is a schematic diagram of a bias voltage selector according to one embodiment.

FIG. 10 is a schematic diagram of a bias voltage selector 300 according to one embodiment.

The bias voltage selector 300 of FIG. 10 illustrates one embodiment of the bias voltage selector 156 of FIG. 6. However, the teachings herein are applicable to bias voltage selectors implemented in other ways.

In the illustrated embodiment, the bias voltage selector 300 includes a first group of selection FETs 292a, 292b, 292c, 292d, . . . 292n that receive a first group of selectable bias voltages Vg_CG2_min, Vg_CG2_min+1LSB, Vg_CG2_min+2LSB, Vg_CG2_min+3LSB, . . . Vg_CG2_max and a first group of selection bits SEL2<0>, SEL2<1>, SEL2<2>, SEL2<3>, . . . SEL2<n>, respectively, for selecting which of the first group of selectable bias voltages to output as a first cascode bias voltage Vg_CG2.

With continuing reference to FIG. 10, the bias voltage selector 300 further includes a second group of selection FETs 293a, 293b, 293c, 293d, . . . 293n that receive a second group of selectable bias voltages Vg_CG3_min, Vg_CG3_min+1LSB, Vg_CG3_min+2LSB, Vg_CG3_min+3LSB, . . . Vg_CG3_max and a second group of selection bits SEL3<0>, SEL3<1>, SEL3<2>, SEL3<3>, . . . SEL3<n>, respectively, for selecting which of the second group of selectable bias voltages to output as a second cascode bias voltage Vg_CG3.

Figure 11A:
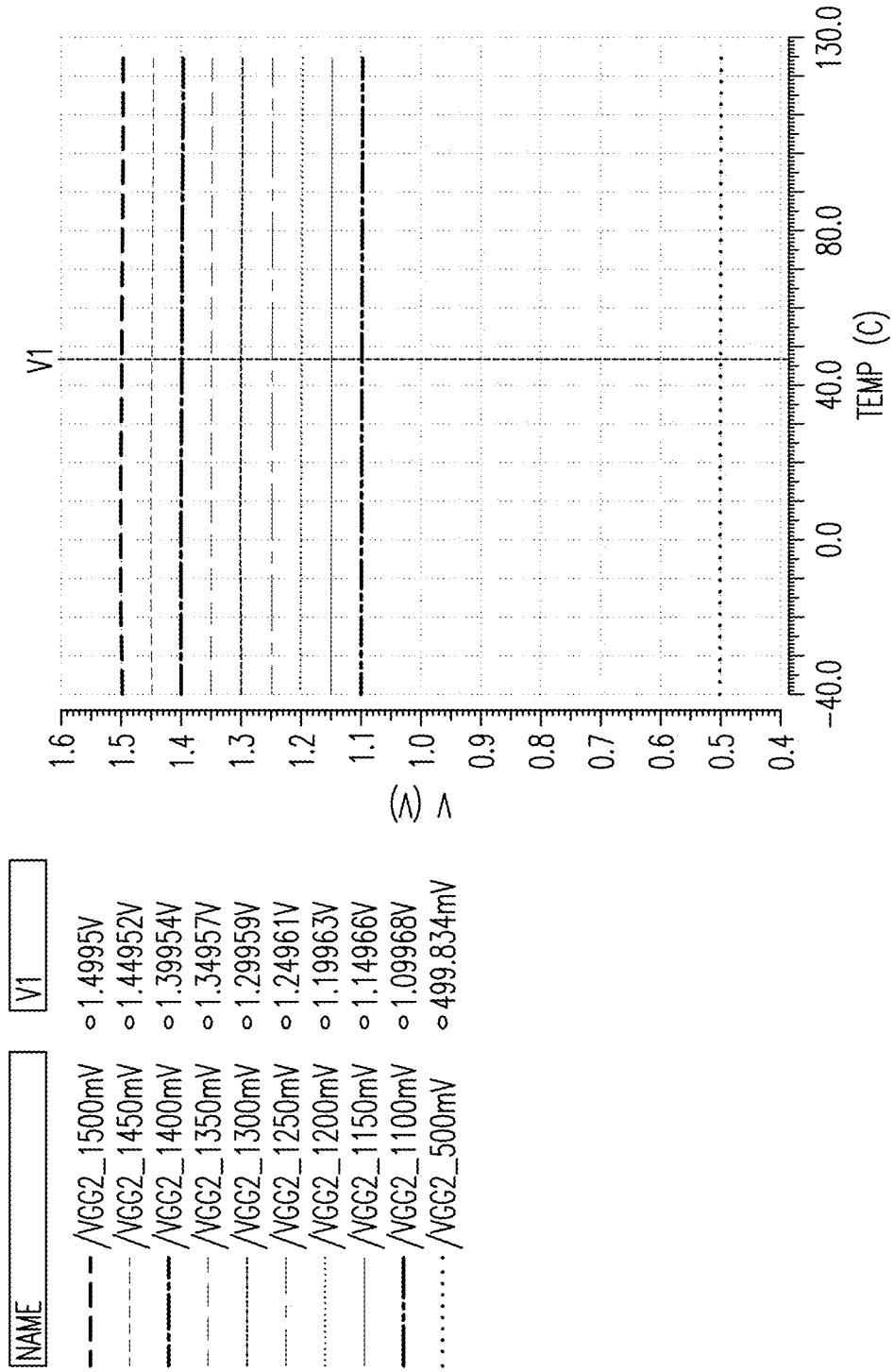
FIG. 11A is a graph of one example of various selectable bias voltages versus temperature.

FIG. 11A is a graph of one example of various selectable bias voltages versus temperature for the bias voltage selector 300 of FIG. 10. The graph depicts example voltage levels of the first group of selectable bias voltages over a temperature range between −40° C. and 125° C.

Figure 11B:
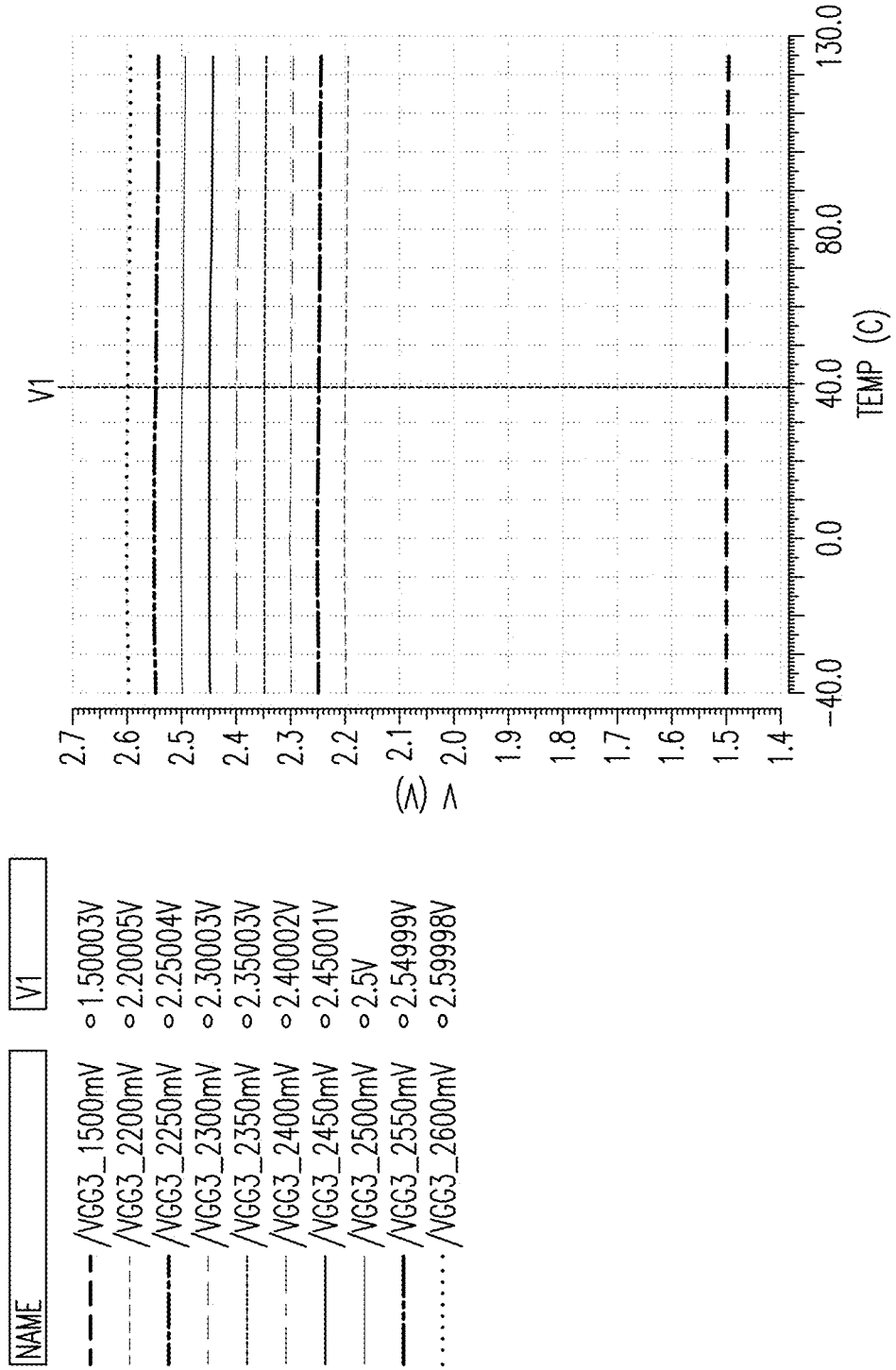
FIG. 11B is a graph of another example of various selectable bias voltages versus temperature.

FIG. 11B is a graph of another example of various selectable bias voltages versus temperature for the bias voltage selector 300 of FIG. 10. The graph depicts example voltage levels of the second group of selectable bias voltages over a temperature range between −40° C. and 125° C.

Figure 12:
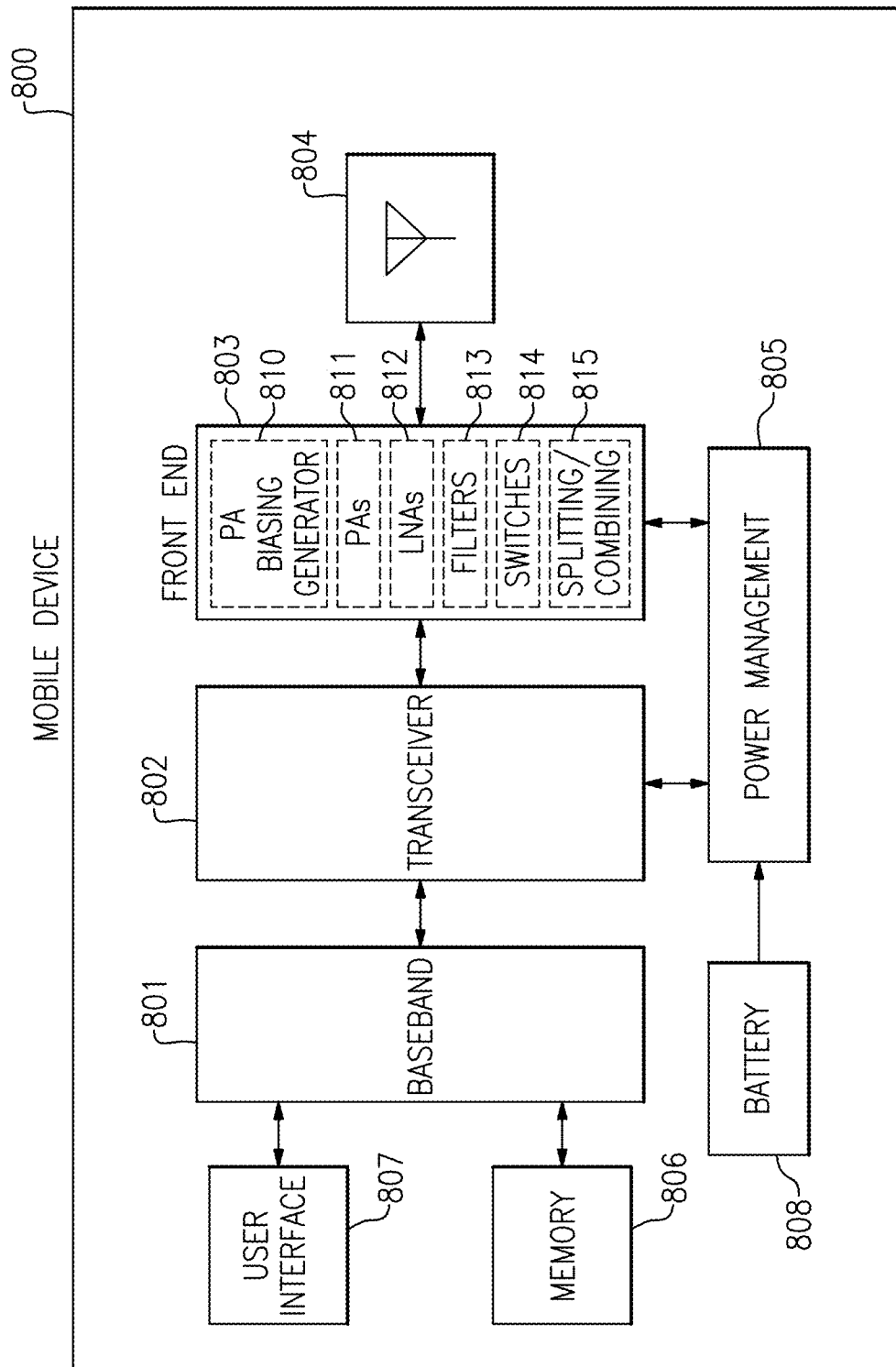
FIG. 12 is a schematic diagram of one embodiment of a mobile device.

FIG. 12 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 12 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes a PA biasing generator 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The mobile device system 800 illustrates one example application of a PA biasing generator implemented in accordance with the teachings herein. However, the PA biasing generators herein can be used in a wide variety of applications.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 12, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 12, the power management system 805 receives a battery voltage from the battery 808. The battery 808 can be any suitable battery for use in the mobile device 800, including, for example, a lithium-ion battery.

Figure 13:
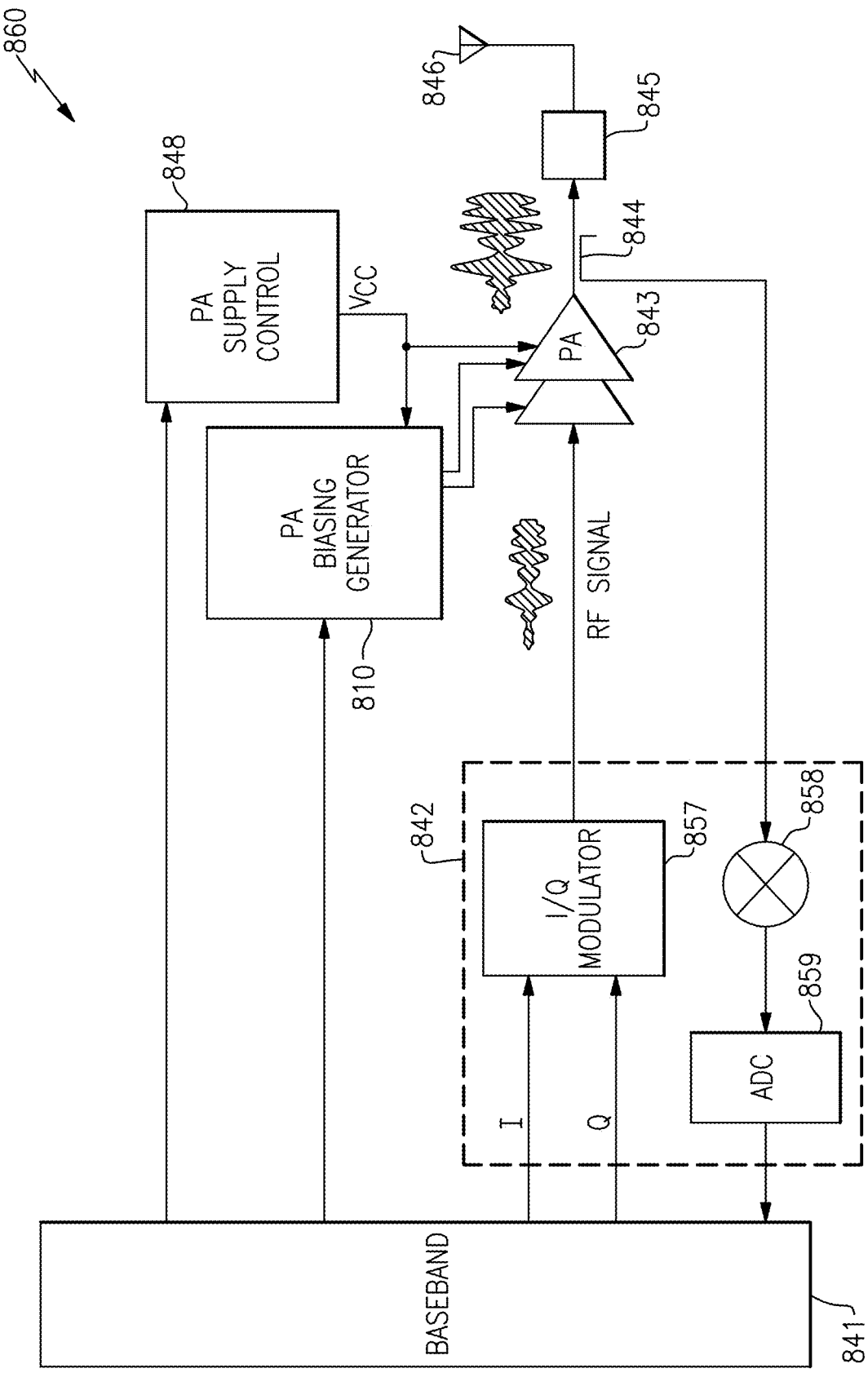
FIG. 13 is a schematic diagram of a power amplifier system according to another embodiment.

FIG. 13 is a schematic diagram of a power amplifier system 860 according to another embodiment. The illustrated power amplifier system 860 includes a PA biasing generator 810, a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 13, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

In the illustrated embodiment, the PA biasing generator 810 serves to generate one or more bias voltages for the power amplifier 843, which can include one or more cascode amplifier stages.

The power amplifier system 860 illustrates another example application of a PA biasing generator implemented in accordance with the teachings herein. However, the PA biasing generators herein can be used in a wide variety of applications.

Figure 14A:
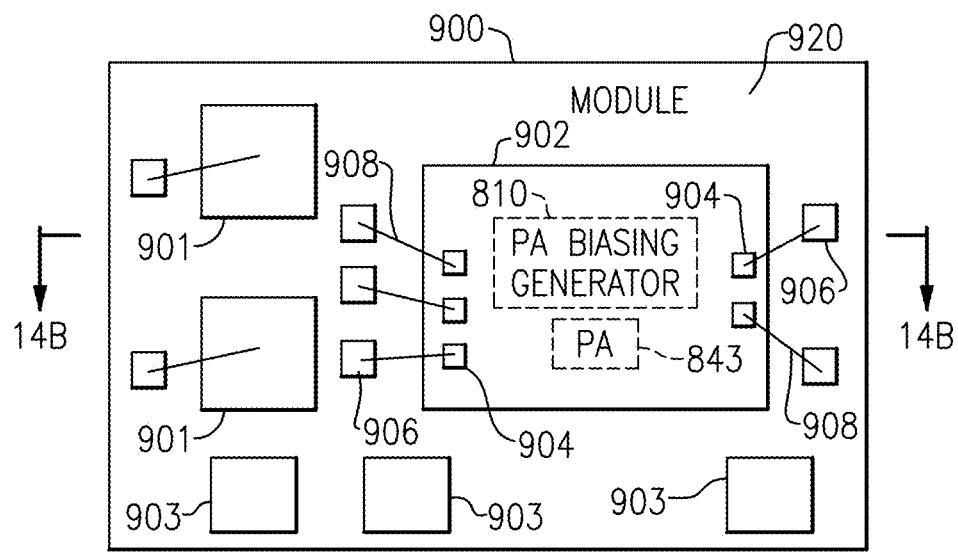
FIG. 14A is a schematic diagram of one embodiment of a packaged module.
Figure 14B:
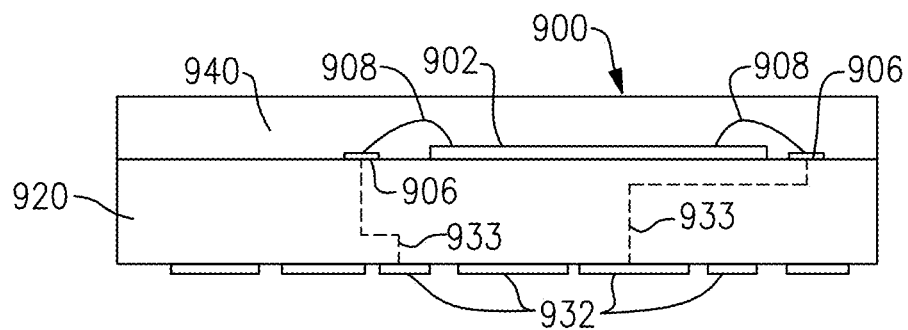
FIG. 14B is a schematic diagram of a cross-section of the packaged module of FIG. 14A taken along the lines 14B-14B.

FIG. 14A is a schematic diagram of one embodiment of a packaged module 900. FIG. 14B is a schematic diagram of a cross-section of the packaged module 900 of FIG. 14A taken along the lines 14B-14B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a power amplifier 843 and a PA biasing generator 810 implemented in accordance with one or more features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 14B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 14B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

APPLICATIONS

Some of the embodiments described above have provided examples of power amplifier biasing in connection with mobile devices (for instance, mobile phones). However, the principles and advantages of the embodiments can be used for any other systems or apparatus that benefit from any of the circuits and systems described herein.

For example, power amplifier systems can be included in various electronic devices, including, but not limited to consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a cascode power amplifier configured to amplify a radio frequency input signal; and
a bias circuit configured to generate at least a first cascode bias voltage operable to bias the cascode power amplifier, the bias circuit including a coarse regulator configured to be powered by a power supply voltage and to generate a regulated voltage, a bandgap reference circuit configured to be powered by the regulated voltage and to generate a bandgap reference voltage, a bias voltage generator configured to generate a plurality of selectable bias voltages based on the bandgap reference voltage, and a bias voltage selector configured to choose the first cascode bias voltage from amongst the plurality of selectable bias voltages.

2. The power amplifier system of claim 1 wherein the cascode power amplifier includes a gain transistor and a first cascode transistor, the first cascode bias voltage configured to bias the first cascode transistor.

3. The power amplifier system of claim 2 wherein the first cascode transistor is a field-effect transistor having a gate biased by the first cascode bias voltage.

4. The power amplifier system of claim 2 wherein the cascode power amplifier further includes a second cascode transistor biased by a second cascode bias voltage from the bias circuit, the bias voltage selector further configured to choose the second cascode bias voltage from amongst the plurality of selectable bias voltages.

5. The power amplifier system of claim 1 wherein the bias voltage generator includes a low dropout regulator configured to generate a buffered bandgap voltage based on the bandgap voltage, and a first string of resistors connected between the buffered bandgap voltage and a ground voltage, the first string of resistors configured to generate at least a portion of the selectable bias voltages.

6. The power amplifier system of claim 1 wherein the bias circuit is configured to bias the cascode power amplifier across two or more voltage levels of the power supply voltage, the two or more voltage levels associated with two or more power supply domains.

7. The power amplifier system of claim 1 wherein the cascode power amplifier is configured to be powered by the power supply voltage.

8. The power amplifier system of claim 1 wherein the coarse regulator includes only a single transistor.

9. A method of power amplifier biasing, the method comprising:
generating a regulated voltage using a coarse regulator powered by a power supply voltage;
generating a bandgap reference voltage using a bandgap reference circuit powered by the regulated voltage;
generating a plurality of selectable bias voltages based on the bandgap reference voltage using a bias voltage generator;
choosing a first cascode bias voltage from amongst the plurality of selectable bias voltages using a bias voltage selector; and
biasing a cascode power amplifier using the first cascode bias voltage.

10. The method of claim 9 wherein the cascode power amplifier includes a gain transistor and a first cascode transistor, the method further comprising biasing the first cascode transistor using the first cascode bias voltage.

11. The method of claim 10 wherein the cascode power amplifier further includes a second cascode transistor, the method further comprising choosing a second cascode bias voltage from amongst the selectable bias voltages using the bias voltage selector and biasing the second cascode transistor using the second cascode bias voltage.

12. The method of claim 9 wherein generating the plurality of selectable bias voltages further includes generating a buffered bandgap voltage based on the bandgap voltage, and generating at least a portion of the selectable bias voltages using a first string of resistors connected between the buffered bandgap voltage and a ground voltage.

13. The method of claim 9 further comprising choosing the first cascode bias voltage based on a control signal received over an interface.

14. A mobile device comprising:
a transceiver configured to generate a radio frequency input signal; and
a front end system including a cascode power amplifier configured to amplify a radio frequency input signal and a bias circuit configured to generate at least a first cascode bias voltage operable to bias the cascode power amplifier, the bias circuit including a coarse regulator configured to be powered by a power supply voltage and to generate a regulated voltage, a bandgap reference circuit configured to be powered by the regulated voltage and to generate a bandgap reference voltage, a bias voltage generator configured to generate a plurality of selectable bias voltages based on the bandgap reference voltage, and a bias voltage selector configured to choose the first cascode bias voltage from amongst the plurality of selectable bias voltages.

15. The mobile device of claim 14 wherein the cascode power amplifier includes a gain transistor and a first cascode transistor, the first cascode bias voltage configured to bias the first cascode transistor.

16. The mobile device of claim 15 wherein the cascode power amplifier further includes a second cascode transistor biased by a second cascode bias voltage from the bias circuit, the bias voltage selector further configured to choose the second cascode bias voltage from amongst the plurality of selectable bias voltages.

17. The mobile device of claim 14 wherein the bias voltage generator includes a low dropout regulator configured to generate a buffered bandgap voltage based on the bandgap voltage, and a first string of resistors connected between the buffered bandgap voltage and a ground voltage, the first string of resistors configured to generate at least a portion of the plurality of selectable bias voltages.

18. The mobile device of claim 14 wherein the bias circuit is configured to bias the cascode power amplifier across two or more voltage levels of the power supply voltage, the two or more voltage levels associated with two or more power supply domains.

19. The mobile device of claim 14 wherein the cascode power amplifier is configured to be powered by the power supply voltage.

20. The mobile device of claim 14 wherein the coarse regulator includes only a single transistor.

* * * * *